(12) United States Patent
Berggren et al.

(10) Patent No.: US 8,603,381 B2
(45) Date of Patent: Dec. 10, 2013

(54) NANOTEMPLATE ARBITRARY-IMPRINT LITHOGRAPHY

(75) Inventors: Karl K. Berggren, Arlington, MA (US); Stefan Harrer, Erding (DE); Giovanni A. Salvatore, Spinete (IT); Joel K. Yang, Cambridge, MA (US)

(73) Assignee: Massachusetts Insitute of Technology, Cambridge, MA (US)

( * ) Notice: Subject to any disclaimer, the term of this patent is extended or adjusted under 35 U.S.C. 154(b) by 487 days.

(21) Appl. No.: 11/542,474

(22) Filed: Oct. 3, 2006

(65) Prior Publication Data
US 2010/0078854 A1    Apr. 1, 2010

Related U.S. Application Data

(60) Provisional application No. 60/723,184, filed on Oct. 3, 2005.

(51) Int. Cl.
*B28B 3/00* (2006.01)

(52) U.S. Cl.
USPC ........... 264/294; 264/299; 264/313; 264/319; 264/300; 264/239

(58) Field of Classification Search
USPC ............. 264/319, 496, 1.38, 174.4, 239, 280, 264/284, 293, 294, 296, 299, 300, 313, 264/316; 438/694, 780, 782, 795, 700
See application file for complete search history.

(56) References Cited

U.S. PATENT DOCUMENTS

| | | | |
|---|---|---|---|
| 3,809,865 A * | 5/1974 | Dimeo | ......................... 358/1.18 |
| 5,772,905 A | 6/1998 | Chou | |
| 6,334,960 B1 | 1/2002 | Willson et al. | |
| 6,365,059 B1 | 4/2002 | Pechenik | |
| 6,517,995 B1 * | 2/2003 | Jacobson et al. | .............. 430/320 |
| 6,680,214 B1 | 1/2004 | Tavkhelidze et al. | |
| 6,719,915 B2 | 4/2004 | Willson et al. | |
| 6,943,117 B2 * | 9/2005 | Jeong et al. | ................... 438/694 |
| 7,345,002 B2 * | 3/2008 | Schaper | ....................... 438/782 |

(Continued)

FOREIGN PATENT DOCUMENTS

| | | |
|---|---|---|
| EP | 1 542 074 A1 | 6/2005 |
| JP | 2002 086463 A | 3/2002 |
| WO | WO 01/20402 A1 | 3/2001 |

OTHER PUBLICATIONS

Khang, Dahl-Young, et al. Room-Temperature Imprint Lithography, Advanced Materials, 2001, 13, No. 10, May 17, pp. 749-751.*

(Continued)

*Primary Examiner* — Richard Crispino
*Assistant Examiner* — Yana Belyaev
(74) *Attorney, Agent, or Firm* — Theresa A. Lober

(57) ABSTRACT

In a method for imprinting a layer of material, a nanotemplate is impressed into a material layer, and the nanotemplate is maintained impressed in the material layer until a geometric trench corresponding to geometry of the nanotemplate is formed in the layer, and the nanotemplate is then removed from the material layer. A nanotemplate geometric trench is repeatedly formed in the material layer by nanotemplate impressions in the layer, until a final desired imprint pattern is produced in the layer. Each nanotemplate geometric trench is characterized by an extent that is a fraction of an extent of the final desired imprint pattern. The material layer is maintained in a condition for accepting nanotemplate impressions continuously throughout the nanotemplate impression repetition.

59 Claims, 10 Drawing Sheets

(56) References Cited

U.S. PATENT DOCUMENTS

| | | | |
|---|---|---|---|
| 2004/0038556 A1* | 2/2004 | French et al. | 438/800 |
| 2004/0124566 A1 | 7/2004 | Sreenivasan et al. | |
| 2004/0192041 A1* | 9/2004 | Jeong et al. | 438/689 |
| 2005/0071969 A1* | 4/2005 | Sirringhaus et al. | 29/4.51 |
| 2005/0098204 A1* | 5/2005 | Roscheisen et al. | 136/263 |
| 2005/0103424 A1* | 5/2005 | Nguyen et al. | 156/67 |
| 2005/0159019 A1* | 7/2005 | Lee | 438/800 |
| 2005/0184436 A1 | 8/2005 | Jeong et al. | |
| 2005/0189676 A1* | 9/2005 | Sreenivasan | 264/225 |

OTHER PUBLICATIONS

Hubert, Schulz, et al. Nanoimprint Techniques, Handbook of Thin Film Materials, vol. 5: Nanomaterials and Magnetic Thin Films, 2002, Academic Press.*

Fabrication of masters for nanoimprint, step and flash, and soft lithography using hydrogen silsesquioxane and x-ray lithography, Ivan Junarsa and Paul F. Nealey, J. Vac. Sci. Technol. B 22, 2685-26690, (2004).*

A study of resist flow during nanoimprint lithography, D.S. Macintyre, S. Thoms, Microelectronic Engineering vols. 78-79, Mar. 2005, pp. 670-675.*

High performance plasmonic crystal sensor formed by soft nanoimprint lithography, Viktor Malyarchuk, Feng Hua, Nathan Mack, Vanessa Velasquez, Jeffrey White, Ralph Nuzzo, and John Rogers, Optics Express, vol. 13, Issue 15, pp. 5669-5675 (2005).*

Fabrication of Si-based nanoimprint stamps with sub-20 nm features, I. Maximov, E.-L. Sarwe, M. Beck, K. Deppert, M. Graczyk, M.H. Magnusson, L. Montelius, Microelectronic Engineering, vols. 61-62, Jul. 2002, pp. 449-454.*

Room-temperature nanoimprinting on metallo-organic complexes, Elisa Mele, Dario Pisignano, Marco Mazzeo, Luana Persano, Giuseppe Gigli, and Roberto Cingolani, J. Vac. Sci. Technol. B 22, 981-984 (2004).*

Oligomer-based organic distributed feedback lasers by room-temperature nanoimprint lithography, Dario Pisignano, Luana Persano, Paolo Visconti, Roberto Cingolani, Giuseppe Gigli, Giovanna Barbarella, and Laura Favaretto, Appl. Phys. Lett. 83, 2545-2548 (2003).*

Room temperature nanoimprint lithography using a bilayer of HSQ/PMMA resist stack, Jiarui Tao, Yifang Chen, Xingzhong Zhao, Adnan Malik, Zheng Cui, Microelectronic Engineering vols. 78-79, Mar. 2005, pp. 665-669.*

Nanolithography with an atomic force microscope for integrated fabrication of quantum electronic devices, Wendel, M.; Kühn, S.; Lorenz, H.; Kotthaus, J. P.; Holland, M. Applied Physics Letters, vol. 65, Issue 14, Oct. 3, 1994, pp. 1775-1777.*

PCT International Search Report and Written Opinion of the ISA, PCT/US2006/038949, mailed Dec. 23, 2008.

Zecchino, "Dektak Stylus Capabilities—How to Choose the Correct Stylus for Any Application," Veeco Instruments Inc., Edina, MN, 2005.

Smith, A model for comparing process latitude in ultraviolet, deep-ultraviolet, and x-ray lithography, J. Vac. Sci. Technol. B, V. 6, N. 1, pp. 346-349, Jan. 1988.

Jung et al., "The atomic force microscope used as a powerful tool for machining surfaces," Ultramicroscopy, V. 42-44, pp. 1446-1451, 1992.

Kumar et al., "Features of gold having micrometer to centimeter dimensions . . . " Appl. Phys. Lett., V. 63, N. 14, pp. 2002-2004, Oct. 1993.

Wendel et al., "Nanolithography with an atomic force microscope for integrated fabrication of quantum electronic . . . ," Appl. Phys. Lett., V. 65, N. 14, pp. 1775-1777, Oct. 1994.

Wendel et al., Sharpened electron beam deposited tips for high resolution atomic force microscope lithography . . . , Appl. Phys. Lett., V. 67, N. 25, pp. 3732-3734, Dec. 1995.

Chou et al., Imprint Lithography with 25-Nanometer Resolution, Science, V. 272, pp. 85-87, Apr. 1996.

Rosa et al., "Direct patterning of surface quantum wells with an atomic force microscope," App. Phys. Letts., V. 73, N. 18, pp. 2684-2686, Nov. 1998.

Xia et al., "Soft Lithography," Annu. Rev. Mater. Sci., V. 28, pp. 153-184, 1998.

Colburn et al., "Step and Flash Imprint Lithography . . . ", SPIE vol. 3676, SPIE Conf. on Emerging Lithographic Technologies III, Santa Clara, CA, Mar. 1999.

Bailey et al., "Step and Flash Imprint Lithography . . . " J. Vac., Sci. Technol. B, V. 18, N. 6, pp. 3572-3577, Nov./Dec. 2000.

Khang et al., "Room-Temperature Imprint Lithography," Adv. Mater., V. 13, N. 10, pp. 749-752, May 2001.

Cappella et al., "Comparison between dynamic plowing lithography and nanoindentation methods," Jnl. of Appl. Phys., V. 91, N. 1, pp. 506-512, Jan. 2002.

Pisignano et al., "Oligomer-based organic distributed feedback lasers by room-temperature nanoimprint lithography," Appl. Phys. Letts., V. 83, N. 13, pp. 2545-2547, Sep. 2003.

McMackin et al., "Design and Performance of a Step and Repeat Imprinting Machine," Emerging Lithographic Technologies VII, Proc. SPIE, V. 5037, pp. 178-186, 2003.

Mele et al., "Room-temperature nanoimprinting on metallo-organic complexes," J. Vac., Sci. Technol. B. V. 22, N. 3, pp. 981-984, May/Jun. 2004.

Hua et al., "Polymer Imprint Lithography with Molecular-Scale Resolution," Nanoletters, V. 4, N. 12, pp. 2467-2471, Nov. 2004.

Mele et al., "Multilevel, Room-Temperature Nanoimprint Lithography for Conjugated Polymer-Based Photonics," Nanoletters, V. 5, N. 10, pp. 1915-1919, 2005.

Harrer et al., Pattern Generation by Using Multi-Step Room-Temp Nanoimprint Lithography, IEEE—NANO 2006, V. 2, pp. 576-579, Jun. 17-19, 2006.

* cited by examiner

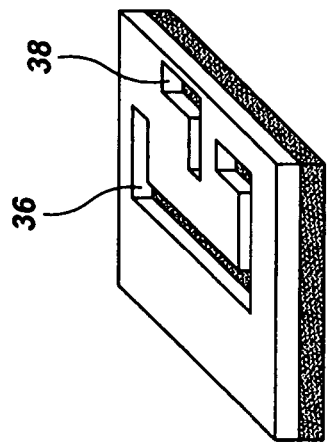
FIG.2A
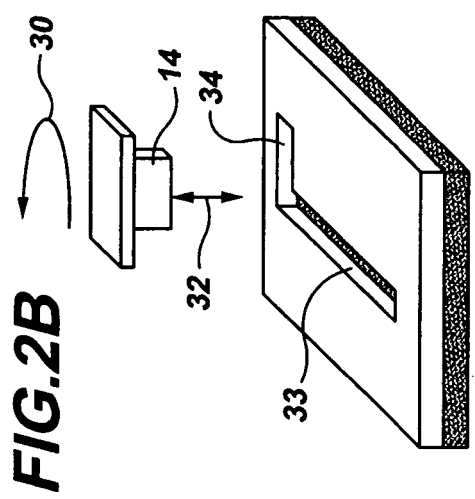
FIG.2B
FIG.2C
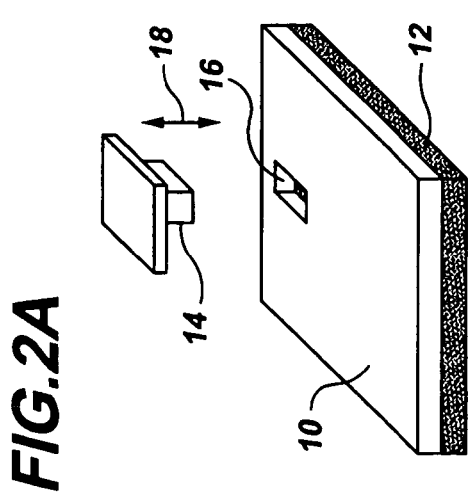
FIG.3A
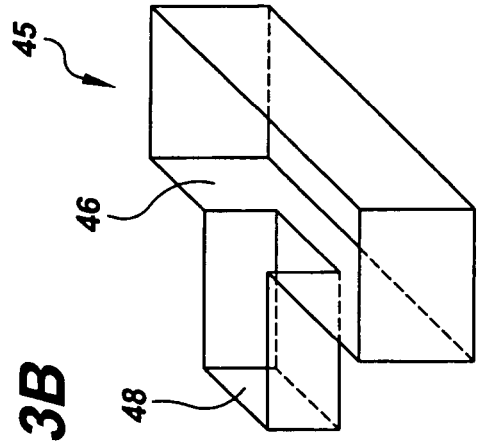
FIG.3B

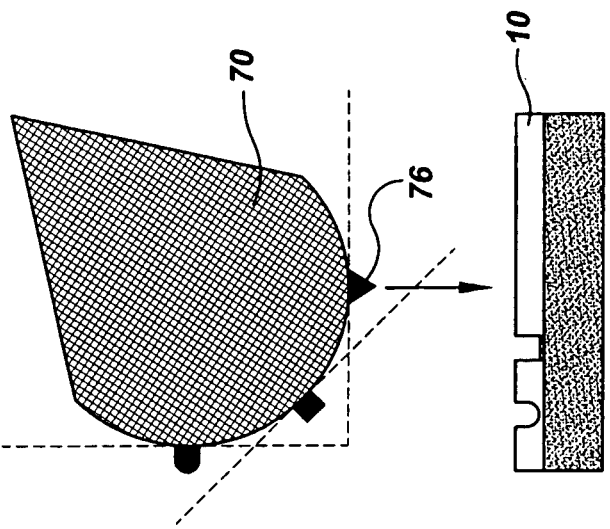
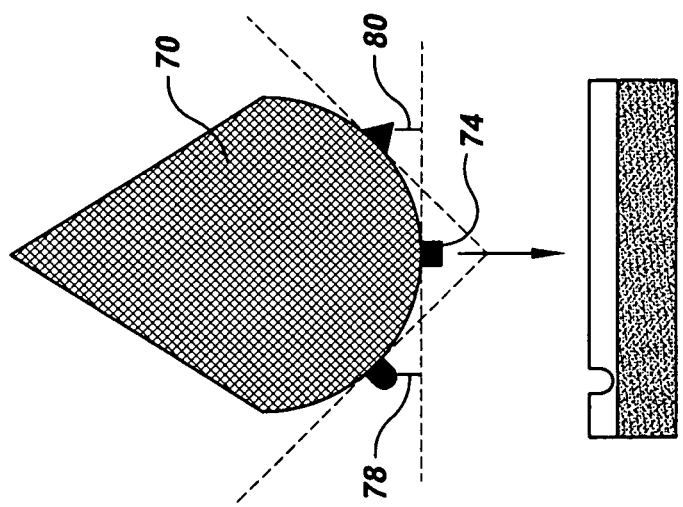
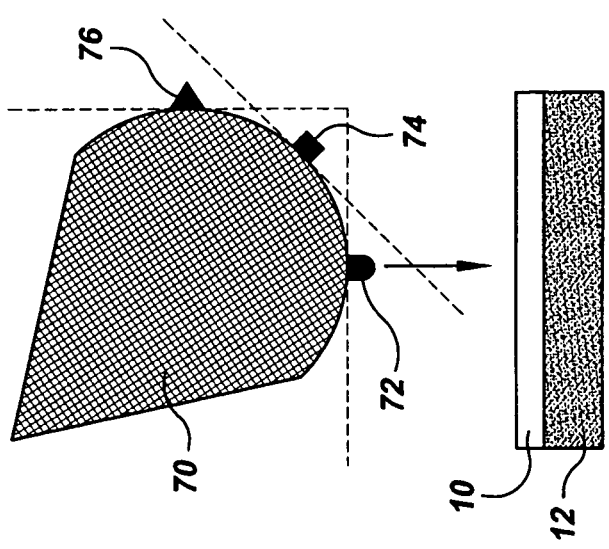

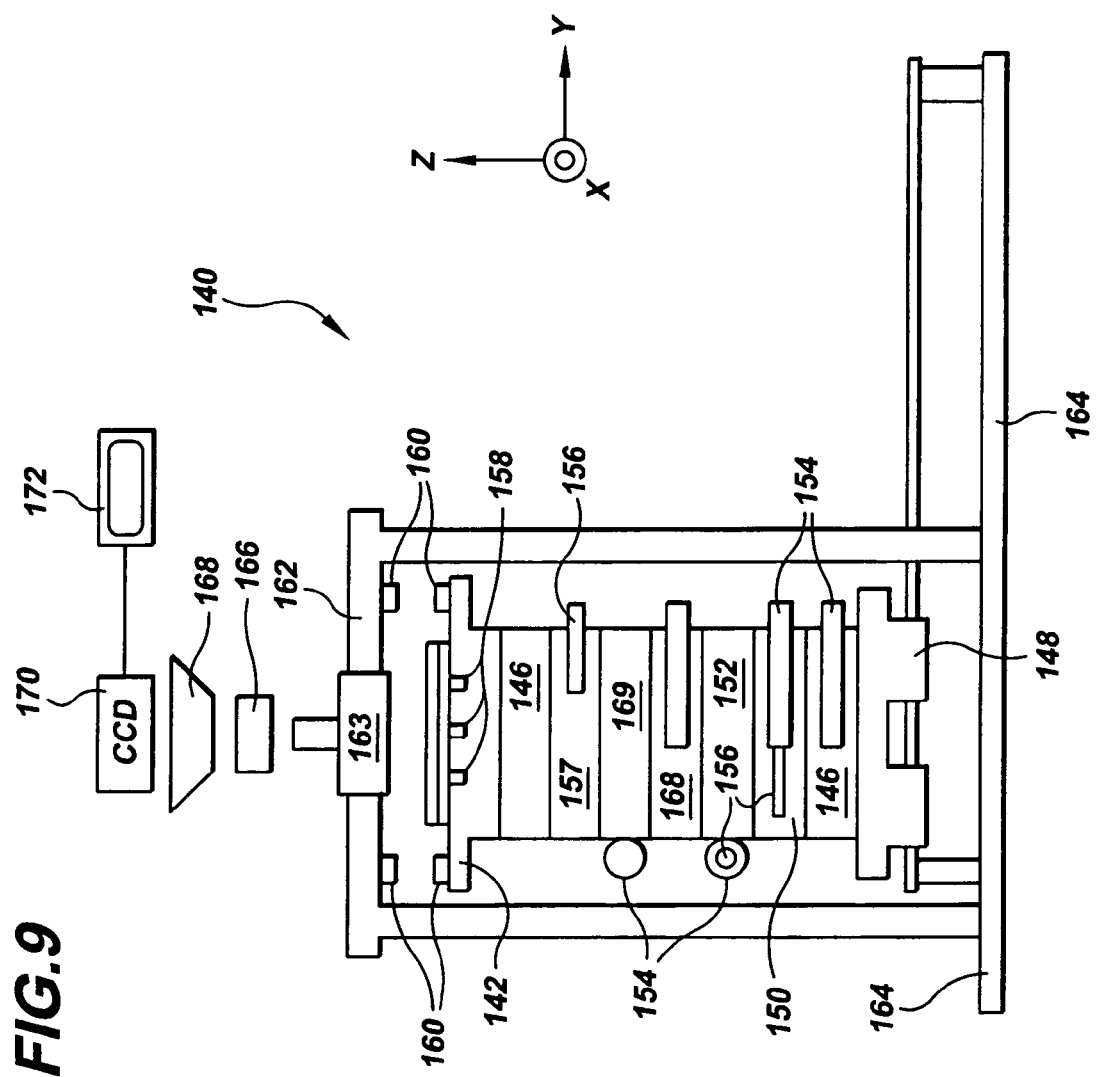

NANOTEMPLATE ARBITRARY-IMPRINT LITHOGRAPHY

CROSS-REFERENCE TO RELATED APPLICATIONS

This application claims the benefit of U.S. Provisional Application No. 60/723,184, filed Oct. 3, 2005, the entirety of which is hereby incorporated by reference.

STATEMENT REGARDING FEDERALLY SPONSORED RESEARCH

This invention was made with Government support under Grant No. FA9550-04-1-0221 awarded by the Air Force. The Government has certain rights in the invention.

BACKGROUND OF INVENTION

This invention relates generally to lithography, and more particularly relates to techniques for nanometer-scale lithography for microelectronic applications.

Many advanced microelectronic applications and much research are directed to nanotechnology and nano-scale systems. The increasing interest in the field of nanotechnology has highlighted a need for improved microelectronic material patterning capabilities at the nanometer length scale. Conventional lithographic techniques do not in general provide methods that are adequate for reliably producing sub-10 nm length-scale features; conventional optical projection lithography cannot print feature sizes less than about 60 nm, and electron beam lithography is generally highly complicated at feature sizes less than about 20 nm. Even with advances in these conventional lithographic techniques, the cost of newly developed lithographic tools is often prohibitive for research as well as commercial applications.

Nanoimprint lithography has recently emerged to address nanometer-scale lithographic requirements for microelectronic materials and semiconductor applications. In general, nanoimprint lithography employs a template or mold to stamp a pattern into a microelectronic material layer, e.g., a polymer layer, that is provided on a substrate. Conventionally, the layer is maintained in a rubbery state as the template is impressed into the layer, and then before removing the template from the layer, the layer is solidified to impose the template pattern in the layer. After removing the template, etching techniques or other processing can be carried out to transfer the pattern imposed in the layer to the underlying substrate or layers provided on the substrate.

Typically, a template to be employed for nanoimprint lithography is fabricated by, e.g., electron beam lithography. Specifically, a customized nanoimprint template is fabricated with electron beam processing to define all of the geometric features of a prespecified pattern to be transferred to, e.g., a substrate or material layer on the substrate. The thusly formed template can then be employed in a nanoimprint lithography process with the substrate, as described above, without the use of conventional lithographic techniques to pattern the substrate. Once the template is made it can be stamped many times. This process is referred to as "amplification". But the requirement for nanometer-scale lithographic patterning of a custom nanoimprint template imposes the same challenges in difficulty, time, and expense that are imposed by electron beam lithographic patterning of a substrate itself. Nanoimprint lithography thereby shifts the difficulty of nano-scale lithography from patterning of a substrate to patterning of a nanotemplate mask. As a result, the ability of nanoimprint lithography to successfully extend beyond conventional lithography to the nanometer regime has heretofore been limited.

SUMMARY OF THE INVENTION

The invention overcomes the limitations of conventional nanoimprint lithography techniques by providing a nanoimprint method that is capable of sub-100 nm lithography of complex and near-arbitrary patterns with multiple imprints of one or more general nanotemplates rather than a single imprint with a larger custom template. In this method for imprinting a layer of material, a nanotemplate is impressed into a material layer, and the nanotemplate is maintained impressed in the material layer until a geometric trench corresponding to geometry of the nanotemplate is formed in the layer, and the nanotemplate is then removed from the material layer. A nanotemplate geometric trench is repeatedly formed in the material layer by nanotemplate impressions in the layer, until a final desired imprint pattern is produced in the layer. Each nanotemplate geometric trench is characterized by an extent that is a fraction of an extent of the final desired imprint pattern. The material layer is maintained in a condition for accepting nanotemplate impressions continuously throughout the nanotemplate impression repetition.

By eliminating the need to fabricate a customized template for each new lithographic application, the Nanotemplate Arbitrary-Imprint Lithographic process (NAIL) method of the invention effectively brings top-down (lithographic) patterning to the nanometer length scale currently reachable only with bottom-up (chemical- and self-assembly-based) fabrication methods. Other features and advantages of the invention will be apparent from the following description and accompanying figures, and from the claims.

BRIEF DESCRIPTION OF THE DRAWINGS

FIGS. 2A-C are schematic views of a second example nanotemplate arbitrary-imprint lithography process in accordance with the invention, shown at three processing stages of the process;

FIG. 3A is a schematic view of a substrate on the surface of which is an imprint material layer including multiple replications of a pattern produced by the second example nanotemplate arbitrary-imprint lithography process of FIGS. 2A-C;

FIG. 3B is a schematic view of an imprint layer material including multiple imprinted geometric trenches of differing depths, forming an example three-dimensional imprinted pattern in accordance with the invention;

FIGS. 6A-6C are schematic views of an example three-step nanotemplate arbitrary-imprint lithography process in accordance with the invention, employing an AFM super-template supporting three example nanotemplates;

FIG. 9 is a schematic view of a mechanical control system provided by the invention for carrying out a nanotemplate arbitrary-imprint lithography process of the invention;

DETAILED DESCRIPTION OF THE INVENTION

Referring to FIGS. 1A-1D there are schematically shown steps of a first example Nanotemplate Arbitrary-Imprint Lithographic process provided by the invention. Hereinafter, this Nanotemplate Arbitrary-Imprint Lithographic process will be referred to as "NAIL." In a first step of the process, shown in FIG. 1A, there is provided an imprint material layer 10, such as a polymer layer, provided on a substrate 12 or other suitable support structure, which can include one or more additional surface layers. Specific characteristics of the imprint layer and substrate are described in detail below.

Figure 1A:
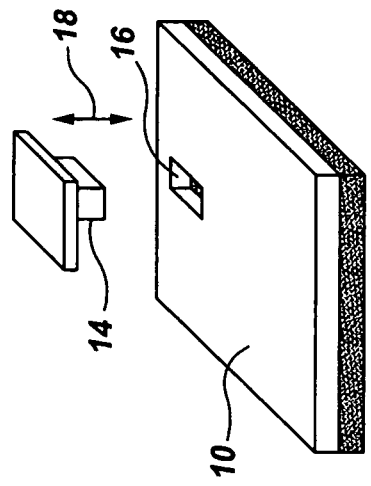
FIGS. 1A-1D are schematic views of a first example nanotemplate arbitrary-imprint lithography process in accordance with the invention, shown at four processing stages of the process.

One or more starting nanotemplates 14 are supplied with a positive pattern, for example, a rectangular shape like that of the example nanotemplate 14 shown in FIG. 1A. "Nanotemplate" herein is meant to refer to a template providing a closed geometric feature that has an extent in the range of between about 1 nm and 100s of micrometers, up to, e.g., about 100 microns. The extent of the geometric feature of the nanotemplate 14 is only a fraction of the extent of a prespecified final pattern to be imprinted in the imprint layer 10. In other words, the nanotemplate is smaller than the final pattern and cannot itself provide the final pattern in one imprint step.

Figure 1B:
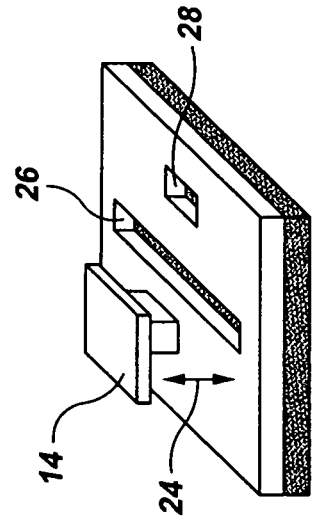

Referring to FIG. 1B, the nanotemplate 14 is pressed into the imprint layer 10, causing the imprint layer to deform as a result of the material characteristics of the imprint layer, explained in detail below. After lifting the nanotemplate out of the imprint layer, a geometric trench corresponding to the nanotemplate geometry remains in the layer; in the example of FIG. 1B a rectangular trench feature 16 corresponding to that of the rectangular nanotemplate 14 remains in the imprint layer. This pressing and then removal of the nanotemplate from the imprint layer is indicated by the double arrow 18. The characteristics of the imprint layer material and the conditions of the imprint process, explained below, are selected such that when the nanotemplate is removed, the geometric trench substantially remains in the imprint layer 10; the imprint layer material does not substantially flow back to fill the trench.

Depending on the pressure applied to the nanotemplate during an impression step and other process conditions, the geometric trench formed by the impression step can extend through the complete thickness of the imprint layer to fully expose the underlying substrate or surface layer, or can extend through only a portion of the imprint layer thickness. In general, for most applications where an impression step is intended to extend through the full thickness of an imprint layer, it is understood that at least a thin layer of residual imprint layer material can remain at the bottom of the geometric trench. The invention does not require a particular condition for the depth of formed trench; it is recognized that particular processing conditions and other application-specific considerations can affect the trench depth. For example, as explained below, if desired the pressure and other impression conditions can be controlled to retain a prespecified thickness of the imprint layer with each impression step.

Figure 1C:
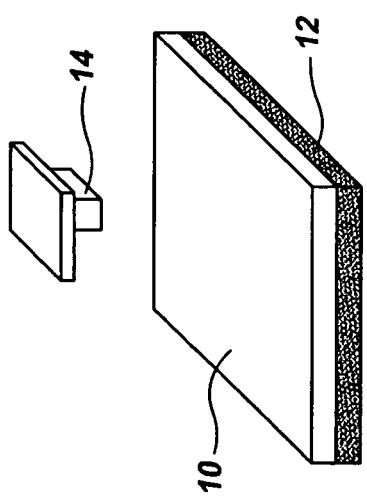
Figure 1D:
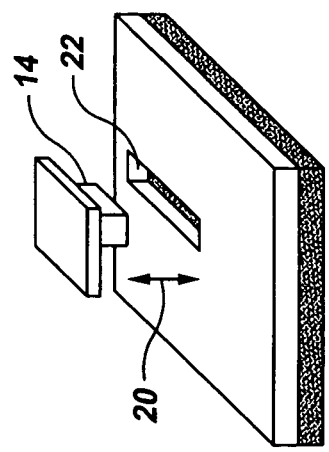

With a first nanotemplate feature impressed into the imprint layer, then, referring to FIG. 1C, the nanotemplate 14 is translated, rotated, or otherwise realigned with the imprint layer as desired to perform a second imprint step, here indicated by the double arrow 20. In the example second imprint step of FIG. 1C, the rectangular nanotemplate 14 is translated such that the second imprint step forms a rectangular trench directly adjacent to the first, whereby the two trenches combine to form in the imprint layer a single elongated rectangular feature 22 larger than the first imprinted rectangular feature 16. Referring to FIG. 1D, the imprint process can be continued, e.g., with a third, fourth, or subsequent imprinting 24 of the imprint layer 10 by the nanotemplate 14, to extend the rectangular feature in the imprint layer to a selected final feature 26.

In addition to the rectangular feature 26, there can be formed additional features, such as the example rectangular feature 28 in FIG. 1D, that are not formed by extension of an earlier imprint in the sequence. The invention does not require that each imprint in a sequence of imprints be directly adjacent for forming a continuous feature; instead, one or more imprints in a sequence of imprints can be separately spatially isolated, e.g., to produce a final desired pattern that includes features which are not connected. In addition, as explained in detail below, a different nanotemplate can be employed for one or more of the imprint steps to produce a near-arbitrary range of imprint feature geometries.

For most applications, where sequential imprint steps are intended to extend a geometric feature, it can be preferred that the sequential imprints be partially overlapping along a geometric trench feature. Such an overlap prohibits the flow of imprint layer material into the trench feature left empty from a previous imprint step, at the very ends of the trench feature, as an imprint is made. It can then be ensured that the resulting extended trench geometry is continuous, without extraneous imprint layer material at locations along the length of the trench.

Once a selected geometry is impressed into the imprint layer, the processing conditions are adjusted, in the manner described below, if required for a given imprint layer material, to effectively "solidify" the imprint layer such that the layer retains the imprinted geometry and will not substantially flow into the geometric trenches formed in the layer. Subsequent processing steps can then be carried out, if desired, for a given application. For example, as explained in detail below, the patterned imprint layer can be employed as a mask for transferring the imprint layer pattern to the underlying substrate or surface layers provided on the substrate.

Referring now to FIGS. 2A-2C, there are schematically shown the steps of a second example NAIL process sequence provided by the invention. In a first step, shown in FIG. 2A, a nanotemplate like that of FIGS. 1A-1D is impressed 18 into an imprint material layer 10 to form a first nanotemplate feature, e.g., the rectangular feature 16, in the layer. The characteristics of the imprint layer material and the conditions of the imprint process, explained below, are selected such that when the nanotemplate is removed, the geometric trench substantially remains in the imprint layer 10; the imprint layer material does not substantially flow back to fill the trench.

Then after a selected number of subsequent steps, shown in FIG. 2B, an elongated feature 33 is formed. The nanotemplate 14 is then in this example rotated 30 and a further imprinting 32 is carried out, directly adjacent to the rectangular feature 33, to form a feature 34 that is orthogonal to the first rectangular feature 33. This example demonstrates that complicated patterns can be formed in the imprint layer with a single nanotemplate by rotation of, or in addition to, translation of the nanotemplate. Referring now to FIG. 2C, the imprinting sequence can then be continued with a selected number of steps until a completed desired pattern 36 is formed in the imprint layer, including, e.g., spatially isolated features 38 and features in a range of geometries in the manner described above. Then the imprint layer is effectively solidified, if necessary for a given imprint layer material, so that the layer substantially retains the imprinted geometry and does not substantially flow into the geometric trenches formed in the layer.

FIG. 3A is a schematic view of a substrate or substrate region 40 including an imprint layer 10 in which a selected pattern 42 has been replicated as selected number of times across the layer. This NAIL replication process is a serial process, in that each nanotemplate impression in each of the pattern replications 42 is sequentially formed in the imprint layer. In other words, one or more nanotemplates are employed to sequentially form the impressions of a pattern, one pattern replication at a time. Thus, unlike conventional mask-based lithography, the NAIL process can be characterized as a serial process. The NAIL process is therefore best suited for applications in which the serial nature of the process can be accommodated.

As shown in FIG. 3A, as a final desired pattern 42 is replicated, the pattern can be adjusted. For example, an additional feature 41 can be added to a selected one or more of the replications, or a number of additional features 43, 44, which can each be adjacent to or physically separated from a pattern, can be added to one or more of the pattern replications. The use of nanotemplates in an impression sequence enables the NAIL process of the invention to provide this flexibility and customization in real time as final desired patterns are produced. Two or more of the replication processes thus can produces final desired patterns that are not identical. The NAIL process of the invention is therefore not a conventional step-and-repeat process. The final desired pattern 42 to be produced can be repeated and/or adjusted across an imprint layer and is a subset of the patterns found across the layer. Thus as used herein, the phrase "final desired pattern" refers not to an array of identical stepped patterns but instead to a single pattern, which can be replicated and adjusted multiple times across the layer.

With this description of the NAIL process of the invention, it is shown that the NAIL method is capable of sub-100 nm lithography of complex and near-arbitrary patterns with multiple imprints of one or more general nanotemplates rather than a single imprint with a larger custom template. The nanotemplate impressions in a sequence of impressions cooperate to form a pattern that is the combination of each of the nanotemplate impressions in the sequence. This is accomplished in accordance with the invention by requiring that each nanotemplate be only a fraction of the size of the final pattern to be formed by a sequence of nanotemplate impressions.

The NAIL process of the invention provides a fundamental shift in how nanoimprint lithography can be performed by eliminating the need for the difficult, slow, and costly step of custom nanoimprint template manufacturing for each new imprinting application. Such custom template fabrication usually requires electron-beam lithography. The NAIL process instead employs one or more general nanotemplate geometries that can be reused for many nanoimprint processes to produce near-arbitrary patterns. By eliminating the need to fabricate a customized template for each new lithographic application, the NAIL method effectively brings top-down (lithographic) patterning to the nanometer length scales currently reachable only with bottom-up (chemical- and self-assembly-based) fabrication methods.

The discovery of the NAIL process of the invention is analogous to the development of the typewriter after the printing press. While a printing press can replicate large-scale molds, such as entire pages of books, at high rates, in the typewriter, the smallest mold unit is a single letter. The typewriter sacrifices throughput in return for flexibility and low cost. Similarly, by removing the difficult and slow step of custom-template manufacturing for each new nanoimprint process, the NAIL process of the invention enables a degree of flexibility and a reduction in processing costs heretofore unattainable for nanometer scale lithographic applications.

In addition, the NAIL method of the invention improves on conventional lithography, and in particular electron-beam lithography, in several ways. First, in the NAIL method, there is no exposure of a device or substrate materials to electron beam or other damaging radiation in the course of the substrate patterning process. Such radiation exposure can for many applications limit the materials that can be employed, prohibiting the use of certain technologically relevant substrates, such as organic semiconductors and ultra-thin tunneling junction devices. Further, materials that show large backscattering effects, such as substrates consisting of atoms with high Z-numbers, are difficult to pattern precisely using electron-beam lithography, but can be readily patterned with the NAIL process. The NAIL process also substantially eliminates shot noise in the replication of devices, although a certain amount of shot noise is unavoidable in the template if it is generated using quanta such as electrons or photons. But with the substantial elimination of shot noise, the NAIL process enables nearly identical devices to be reproduced in large quantities.

Turning now to particulars of the NAIL process of the invention, first is considered characteristics of the imprint layer to be employed. In general, a wide range of imprint materials can be employed so long as they enable formation of a sequence of nanotemplate-based geometric trenches in the imprint material layer. A particularly well-suited class of materials are polymer materials, here meant to also include oligomers, in that an oligomer is a short polymer, e.g., an oligomeric PMMA is a PMMA with a molecular weight that is too low to allow it to be called a true polymer, because the molecular weight is in the thousands or less. The invention as described herein includes oligomers as polymers and the discussion is applicable to both.

Example nanotemplate imprint layer polymer materials include polymethylmethacrylate (PMMA); hydrogen silsesquioxane (HSQ); polydimethylsilazene (PDMS); conjugated light-emitting polymers, for example red-emitting polymers, green-emitting polymers, or blue-emitting polymers; the thiophene-based oligomer 3,3',4''',3''''-tetracyclehexyl-3'',4''-dihexyl-2,2':5',2'':5'',2''':5''',2'''':quinquethiophene-1'',1''-dioxide (T5oCx); polystyrene (PS), for example having a molecular weight between about 10 kg/mol and about 300 kg/mole, with the following average molecular weights particularly well suited: 13 kg/mol, 30 kg/mol, 64 kg/mol, 97.4 kg/mol, and 250 kg/mol; the Eu-based compound tris(benzoylacetonato)-mono(phenanthroline)-europium(III); and the Eu-based compound tris(dibenzoylmethane)-mono-(phenanthroline)europium(III). Other suitable polymers and other materials can also be employed.

For many applications, it is found that preferable polymer materials can include PMMA; 3,3',4''',3''''-tetracyclehexyl-3'',4''-dihexyl-2,2':5',2'':5'',2''':5''',2'''':quinquethiophene-1'',1''-dioxide (T5oCx); the Eu-based compound tris(benzoylacetonato)-mono(phenanthroline)-europium(III); the Eu-based tris(dibenzoylmethane)-mono-(phenanthroline)europium (III); and PS.

In general, whatever material is selected as an imprint layer material, the material preferably exhibits, under controlled conditions, a gel-like consistency. This is meant to say that, under conditions of an imprint process, the imprint layer material is soft enough that it can be imprinted with a nanotemplate without the application of unduly high pressure while at the same time the imprint layer material is mechanically stable enough that the during a sequence of NAIL imprints, the material does not substantially backflow into previously imprinted trench geometries under the selected process conditions.

For many applications, ideally the selected imprint material displays these characteristics at around room temperature. The thiophene-based oligomer T5oCx; the Eu-based compounds tris(benzoylacetonato)-mono(phenanthroline)-europium(III) and tris(dibenzoylmethane)-mono-(phenanthroline)europium(III); and PS are particularly well-suited in this regard; these polymers can be imprinted at room temperature, in air, without the need for heating and cooling or curing steps. They further do not produce any backflow effects into previously imprinted geometric trenches as sequential imprints are made, and enable the formation of a nanotemplate imprint under reasonable pressures, e.g., 1-150 MPa. Thus these room-temperature imprint layer materials are particularly well-suited for the NAIL process because they are characterized, as deposited, in a single specific physical state that enables ease of nanotemplate impression into the material and that maintains imprinted features in the material in a solidified state, subsequent to impression, without particular curing or other processing of the material. However, a wide range of other polymers can be employed, such as those listed above, recognizing that there can be required control of processing conditions that enable the desired NAIL imprint layer characteristics during a NAIL patterning process.

For those imprint layer materials that cannot operate at room temperature, it can be preferred that the NAIL lithographic process be carried out on a selected imprint layer material with the material near to or below the characteristic glass transition temperature, $T_g$, of the material, to attain the gel-like material consistency described above. For example, PMMA is in general too mechanically hard to accept NAIL nanotemplate impressions at its glass transition temperature of ~110° C. It therefore can be preferred to employ PMMA as an imprint layer material by heating the PMMA to about 130° C., about 20° C. above the glass transition temperature. It is understood that at this raised temperature, some residual backflow of PMMA into previously imprinted geometric trenches may take place, depending on the conditions of a given application. Here the material ideally flows back very slowly, i.e., slowly enough to allow time for performing several sequential NAIL imprint steps before the imprinted trenches are leveled out.

With this example, it is shown that some empirical analysis can be required to specify process conditions that optimize an imprint material's characteristics for the NAIL process criteria of a given application. In selecting a material process temperature, there is required a balance between heating to increase material softness and cooling to increase material stability. Where heating of a selected imprint layer material is to be employed, it can be preferred that the selected imprint layer material exhibit sufficient thermal conductivity to enable homogenous heating of the material through the material thickness and across its extent.

In general, for a given pattern to be formed in an imprint layer by a sequence of nanotemplate impressions, it is preferred that the entire imprint sequence be completed before the imprint layer relaxes sufficiently to substantially flow into the geometric trenches of the pattern. This consideration can for many applications set the requirements for the imprint layer material and/or set the maximum number of impression cycles that can be carried out on a given imprint material. Thus, for a complicated pattern requiring a large number of nanotemplate impressions, a relatively stiffer imprint material can be preferred.

In accordance with the invention, a selected NAIL imprint layer material can be engineered to provide selected characteristics such as imprintability. For example, the polymer PMMA can be engineered, e.g., to lower the glass transition temperature of PMMA, by reducing the length of the PMMA side chains; this in turn enables a lower temperature for the NAIL process. Similarly, it is recognized that the shorter the chain-length of an imprint polymer layer material, the softer the material. With material considerations such as this, a suitable material for a given application can be identified and/or engineered. The invention thus contemplates engineering of polymer and other materials to obtain selected characteristics for enabling the formation of a sequence of nanotemplate impressions in the layer.

In addition to polymer materials, non-polymer imprint layer materials can be employed, such as a rigid-core oligothiophene; the diamine derivative (N,N'-diphenyl-N,N'-bis(3-methylphenyl)-1,1'-biphenyl-4,4'diamine); various linear oligothiophene-S,S'-dioxides; a phenyl-based oligomer with one central thiophene moiety; a molecule with a branched benzo[b]thiophene based structure; $Alq_3$ (8-hydroxyquinoline aluminum) e.g., doped with 2 wt % DCMII dye molecules; or PMMA in a matrix form, e.g., blended with one or more various semiconducting small molecules such as $Alq_3$ or DCMII.

For a selected imprint layer material, there can be defined a minimum required imprint duration for producing a maximum imprint depth for a given nanotemplate geometry and imprint material characteristics. In general, the softer the imprint layer material, the shorter a minimum required imprint duration, for a given imprint pressure; while the higher the imprint pressure, the shorter the minimum required imprint duration. For a given pressure, a shorter imprint duration can result in a higher aspect ratio of the material walls at edges of an imprinted features, due to material being pushed up vertically instead of horizontally. For many applications and imprint layer materials, an imprint pressure of between about $10^6$ Pa and about $10^9$ Pa can be suitable.

The imprint pressure applied to a nanotemplate determines the depth of a corresponding imprinted feature into an imprint layer. In accordance with the invention, imprint pressure, and the corresponding imprint depth into an imprint layer, can be varied from one imprint step to a next in a sequence of imprint steps. Such variation in pressure can be employed, e.g., to produce a three-dimensional pattern in the imprint layer. Specifically, a reduction or increase in imprint pressure can be selected, from one impression to the next, to adjust the depth of each impression. FIG. 3B is a schematic view of an example geometry 45 illustrating this condition. A first imprinted feature 46 is at a first imprint depth in a material layer, while a second imprinted feature 48 is at a second, more shallow depth in the material layer. This enables the production of custom three-dimensional structures that can be employed in applications for, e.g., microfluidics, multilayer electronic and/or optical devices, and three-dimensional nanoimprint molds.

The NAIL process of the invention can under some conditions and for some applications be a volume-preserving patterning process, in that imprint layer material is pushed away from a geometric imprinted feature trench in the imprint layer, forming raised deformations at the edges of the trench. It is understood that this imprint layer distortion, as well as imprint layer deformation and imprint depth are dependent on characteristics of a particular imprint material, the imprint duration of a given imprint step, and the shape of a given nanotemplate geometry. In general this distortion is preferably minimized or ideally eliminated.

But in selected cases and for particular applications, these effects, and particularly material distortion, can be exploited to form useful patterns. Such an intended deformation can be employed to produce a selected pattern, e.g., a grating structure, that is exclusively formed by distortion of an imprint material layer. In an example process for forming such a grating structure, an "I"-shaped nanotemplate geometry can be employed with the longitudinal direction of the "I" oriented parallel to a direction intended for grating lines. The nanotemplate is stepped laterally through a sequence of impressions, with a step size equal to the desired width of grooves of the grating structure. The grating lines are then formed by imprint material that is pushed to that side of the nanotemplate facing the already-imprinted features. By varying the step size of the mold between subsequent imprint steps one can generate grating structures with pitches varying accordingly.

By varying the applied imprint pressure and/or imprint duration between subsequent imprint steps one can vary the height of the generated grating lines. By using one or both of these variation techniques one can locally modulate the pitch and/or the depth of the generated grating structures, enabling the addition of information to the generated pattern in the manner of frequency modulation (FM) and amplitude modulation (AM) in radio technology.

Whatever imprint layer material is employed, in general the imprint layer thickness is selected based on requirements of a given application, such as the deformation application just described, and based on the process parameters of a given imprint sequence. For many applications, it is the process of forming an imprint layer material on a substrate or other support structure that sets a practical range of imprint layer thicknesses. An imprint layer thickness of greater than about 10 nm is generally a result of this limitation. The invention does not require a particular imprint layer thickness, and thus any thickness that enables both successful material layer formation and successful imprinting and subsequent processing can be employed.

Given deposition constraints, the preferred thickness for a PMMA imprint layer can be about 120 nm; the preferred thickness for a T5oCx imprint layer can be greater than about 150 nm, a thickness of about 300 nm can accordingly be preferred for the Eu-based compounds tris(benzoylacetonato)-mono(phenanthroline)-europium(III) and tris(dibenzoylmethane)-mono-(phenanthroline)europium(III); and a PS imprint layer thickness of between about 30 nm and 600 nm can be preferred.

In preparation of an imprint layer for the NAIL process, the imprint layer material is first deposited in a suitable method on a substrate or other selected structure as just described. For example, PMMA can be spin-coated onto a substrate and then heated up to the desired temperature by putting the substrate-polymer arrangement on a conventional hot plate, heated wafer chuck, or other heating system. For many applications, it can be preferred that the imprint layer be deposited on a substrate at a homogenous thickness across the substrate. In this case, if spin-coating is employed as deposition technique, it can be preferred to employ a wafer chuck that uniformly applies a vacuum to the substrate and holds the substrate in position in a manner such that the spin coating results in uniformity of thickness. Conventional concentric ring vacuum chucks can in general meet this requirement. The invention does not universally require this condition, however, and indeed contemplates applications in which a non-uniform imprint layer thickness can instead be preferred.

In an example with T5oCx (7%) employed as the imprint layer material, the T5oCx layer can be spin-coated onto a substrate at a speed of, e.g., about 1600 rpm. With $3.6 \times 10^{-2}$ M chloroform solutions of the Eu-based compounds tris(benzoylacetonato)-mono(phenanthroline)-europium(III) or tris (dibenzoylmethane)-mono-(phenanthroline)europium(III) employed as an imprint layer material, these materials can be spin-coated onto a substrate at about 1500 rpm. When using PS with an average molecular weight of 97.4 kg/mol (dissolved in toluene to a concentration of 5% per weight) as the imprint layer material, the PS can be spin-coated onto a substrate at about 2500 rpm, followed by a post-spin bake at, e.g., about 120° C. for about two minutes.

The invention does not require spin coating of an imprint layer material on a substrate. Dip coating and other wet deposition techniques can be employed; here an initial adhesion layer can first be applied to the substrate if necessary. Alternatively, vapor deposition processes such as thermal evaporation, chemical vapor deposition, or plasma-based deposition, and physical deposition techniques, such as sputtering, can all be employed if such can provide working deposition conditions for a given selected material.

Any suitable substrate material can be employed for the NAIL process, and any combination of surface layers can be provided on the substrate, underlying the imprint layer, for subsequent etching or other processing of the underlying layers and/or substrate. Substrates can include any suitable microelectronic material, e.g., silicon, quartz, fused silica, or other substrate, such as glass, polymer, plastic, or other material, so long as the selected substrate material can withstand the NAIL processing conditions. Conducting, insulating, and/or semiconducting layers can be provided on the substrate, including, e.g., copper, aluminum, nickel, gold, polysilicon, silicon and other semiconductors, oxides such as $SiO_2$, nitrides such as $Si_3N_4$, and other materials suitable for a given application. Where a selected imprint layer material is to be heated during a NAIL process, it can be preferred that the substrate and any layers provided on the substrate be good thermal conductors to enable heating of the imprint layer. Silicon can be an excellent substrate for imprint materials like PMMA that in general require heating, and is also well-suited as a substrate for PS or other materials that can be imprinted at room temperature.

No special surface preparation of a selected substrate is necessary. Cleaning of the substrate prior to imprint layer deposition can in general be preferred. For example, for a silicon substrate cleaning can be carried out with ultrasonic bath followed by an RCA clean and a subsequent dry-bake.

The imprint layer polymer can then be directly applied to the substrate and processed as necessary for the given material.

In accordance with the invention, once the imprint layer is formed on a selected substrate, the imprint layer is then conditioned, e.g., by heating or other processing, to accommodate a NAIL patterning impression sequence. For example, it can be preferred to bake a PMMA imprint layer for, e.g., about 30 min at a temperature of, e.g., about 180° C. and to bake a PS layer for, e.g., about 2 min at a temperature of, e.g., about 120° C. to reduce strain within the polymer prior to the NAIL process. The imprint layer-coated substrate can then be heated, if necessary, for NAIL imprinting. For polymers such as T5oCx or PS that do not require heating for the NAIL process, the process temperature can be maintained at about room temperature with a suitable substrate support structure employed.

Figure 4:
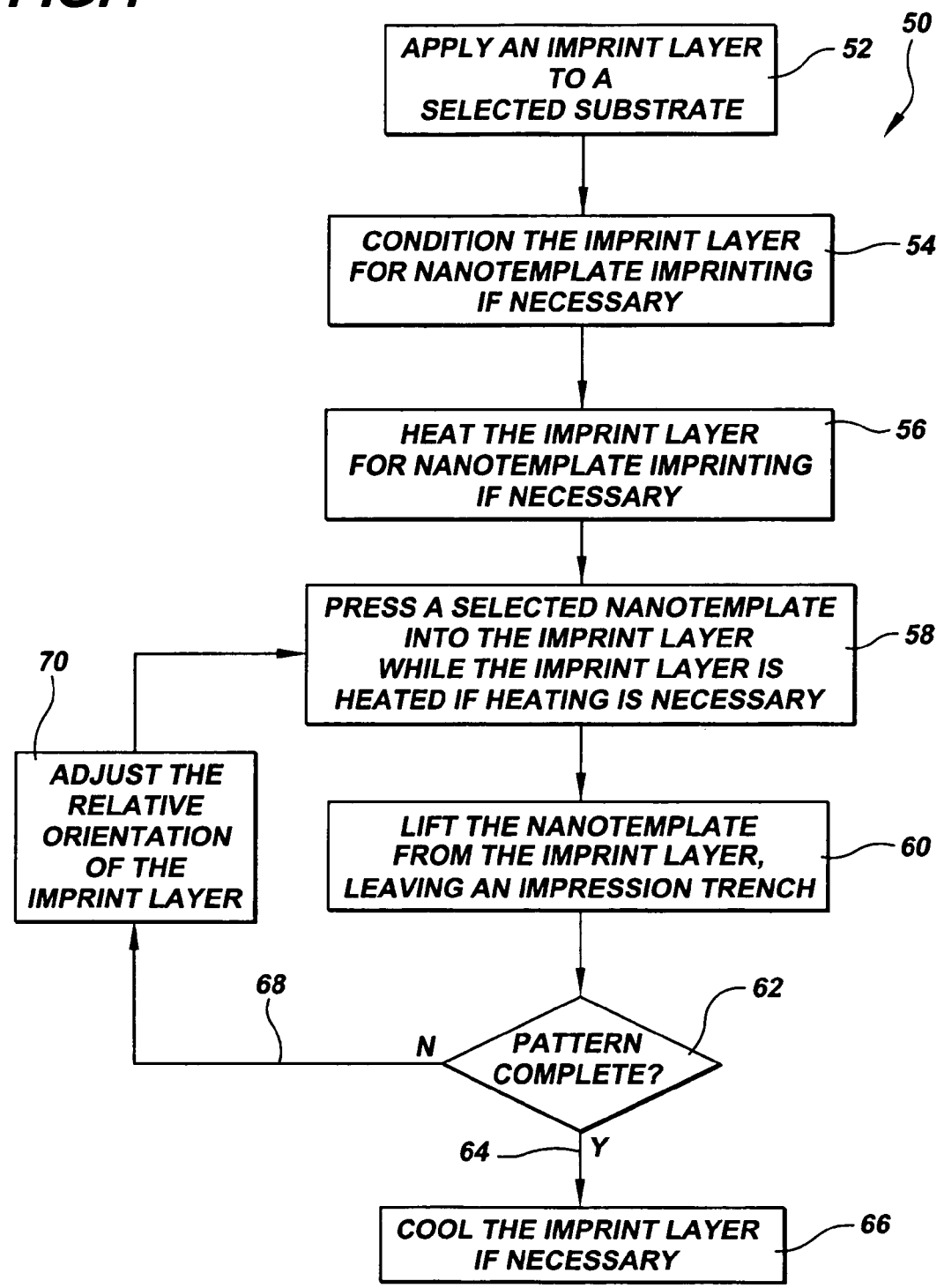
FIG. 4 is a flow chart of the steps of an example nanotemplate arbitrary-imprint lithography process in accordance with the invention.
Figure 5C:
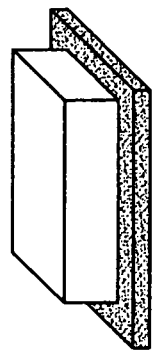
FIGS. 5A-5I are schematic views of example nanotemplate geometries that can be employed in accordance with the invention.
Figure 5F:
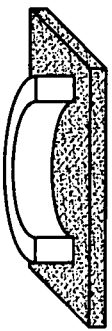
Figure 5I:
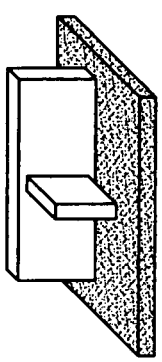
Figure 5B:
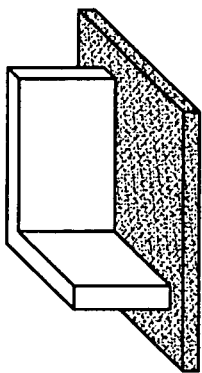
Figure 5E:
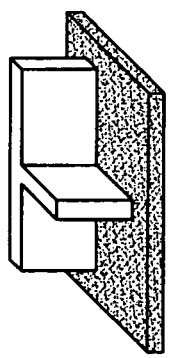
Figure 5H:
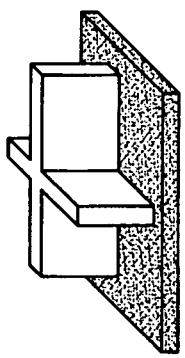
Figure 5A:
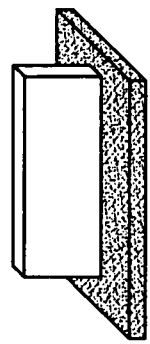
Figure 5D:
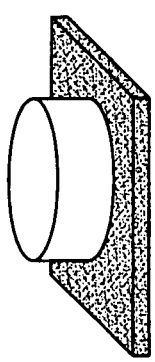
Figure 5G:
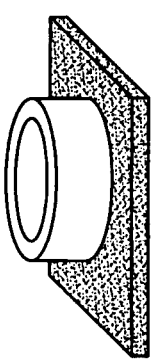

Referring to the flow chart of FIG. 4, with this discussion of imprint layer characteristics and preferable processing, the complete sequence of steps of a NAIL process 50 of the invention can be specified. In a first step 52, a selected imprint layer material is applied to a selected substrate or other support structure in the manner described above. Then if necessary, the imprint layer is conditioned 54, e.g., by a strain reduction bake or other conditioning step, to prepare the imprint layer for nanotemplate impression of the layer. If necessary, the imprint layer is then heated 56. This heating is maintained through the NAIL process until pattern formation in the layer is complete.

With the imprint layer heated, if necessary, a selected nanotemplate is then pressed 58 into the imprint layer to form a geometric trench in the layer corresponding to the geometry of the nanotemplate. The nanotemplate is then lifted 60 from the imprint layer, leaving a geometric trench in the imprint layer. If the pattern thusly formed in the imprint layer is found 62 to be the desired final pattern 64, then the imprint layer is cooled 66, if necessary, and the NAIL imprint process is complete.

If the pattern is found not to be the desired final pattern 68, then the orientation of the imprint layer is adjusted 70 relative to the location of nanotemplate impression. Then a selected nanotemplate is pressed 58 into the imprint layer, while the imprint layer is heated if necessary. After the nanotemplate is lifted 60 from the imprint layer, leaving an additional geometric trench, it is again determined 62 if a desired pattern is complete. If not 68, then the process of nanotemplate imprinting is continued until the pattern is indeed complete, after which the imprint layer is cooled 66 if necessary. With this last step, the NAIL process of the invention produces a pattern of one or more geometric trenches in the imprint layer in a selected configuration.

Turning now to considerations for the NAIL nanotemplate provided by the invention, any suitable nanotemplate geometry can be employed, such as those shown in FIGS. 5A-5I. The nanotemplate geometries of FIG. 5 are only a small fraction of all possible and useful geometries that the NAIL process of the invention can employ. Each nanotemplate geometry preferably extends in the range of 1-100's of nanometers. As explained above, in accordance with the invention, for producing a final desired pattern with the NAIL process, one or a plurality of nanotemplates are employed that each are only a small fraction of the extent of the final pattern. Thus one nanotemplate impression is only a portion of a final pattern to be formed in an imprint layer.

The intent of the NAIL process of the invention is not to use a complex pattern form but instead to employ one or more nanotemplate forms that are as uncomplicated as possible. One of the main advantages this provides is the elimination of a need to generate a complicated imprint template for each new imprint application—once a set of nanotemplates is produced, the set can be used over and over for multiple imprinting applications. As a result, the NAIL process bypasses time consuming and expensive imprint mask fabrication. The invention does not preclude the use of complicated nanotemplates; if desired, one or more complicated nanotemplate geometries can be employed, and conventional electron-beam-fabricated nanoimprint templates can be employed. But the NAIL process specifically provides a technique that eliminates the need for such templates. Accordingly, NAIL nanotemplates are preferably not to be limited by complexity.

Each nanotemplate to be employed in the NAIL process of the invention can be provided as any suitable rigid form providing a selected geometry. For many applications, a patterned material such as silicon or quartz can be employed as a nanotemplate. For some applications it can be preferred to employ a nanotemplate having three components, namely, a substrate, a pattern layer, and optionally, a release, i.e., anti-sticking, layer.

Examples of suitable nanotemplate substrates include silicon substrates; fused silica plates, e.g., from CVI Laser, Covina, Calif., as LLC: PW1-1525-UV, LLC: PW1-1025-UV; AFM tips, as explained below; and quartz plates, e.g., from Corning, Inc., Corning, N.Y. The thickness of the nanotemplate substrate can be selected based on desired operations for a given NAIL process cycle. For example, it can be desirable to enable observations of nanotemplate-imprint layer alignment and to make in situ misalignment corrections during multiple nanotemplate impressions by observing previously imprinted geometric trenches and the movement of a nanotemplate. In this scenario, an optical microscope can be employed and it is preferable that the nanotemplate be transparent. Specifically, it is preferred that the optical thickness of the nanotemplate plus the distance between nanotemplate features and the imprint layer be smaller than the longest working distance of the best available objective for the optical microscope with adequate magnification. This consideration significantly limits the thickness of a substrate that can be employed for a nanotemplate, depending on the required magnification Where a pattern layer is to be employed in a nanotemplate, the pattern layer is that layer which includes a desired nanotemplate geometry. Example materials for the nanotemplate pattern layer include, e.g., a 1:1 mixture of HSQ and MIBK, PMMA, SU-8 2050 photoresist, and hard poly(dimethylsiloxane) (h-PDMS). For many applications, (HSQ:MIBK, 1:1) can be preferred, and can be applied to a selected nanotemplate substrate by spin coating at, e.g., about 5 rpm for, e.g., about 60 seconds, resulting in a 120 nm-thick (HSQ: MIBK, 1:1) layer. The pattern layer preferably is about at least as thick as the selected imprint layer to enable formation of a geometric trench through substantially the entire imprint layer thickness, but can be adjusted to form selected trench depths as-desired for a given application. Once applied to a substrate, the pattern layer can then be patterned to provide a selected nanotemplate geometry in the manner described below.

In an alternative scenario, the nanotemplate substrate can itself also act as a pattern layer. Here the substrate can be patterned to provide a selected nanotemplate geometry on the substrate. For example, photoresist can be spin-coated on the nanotemplate substrate and patterned by interference lithography (IL), e-beam lithography, direct thermal imprint lithography, any possible combinations of these techniques, or any other suitable patterning technique. The photoresist pattern is then transferred to the underlying substrate by conventional techniques, e.g., wet or dry etching steps. The photoresist layer is then removed. With this patterning of the nanotemplate substrate, the pattern layer and the substrate are a solitary unit, with the pattern layer being the upper part of the substrate. Silicon substrates are particularly well-suited for this arrangement as they are amenable to precise lithographic patterning.

For some applications, it can be preferred to include a release layer on the pattern layer of the nanotemplate substrate or the all-in-one substrate nanotemplate. The lateral extent of the nanotemplate and materials characteristics of the imprint layer and the pattern layer are to be considered in determining the necessity of a release layer. If such is required, an example preferred material for the release layer is $C_8H_4Cl_3F_{13}Si$, known as tridecafluoro-1,1,2,2 tetrahydrooctyl trichlorosilane, available from Gelest, Philadelphia, Pa. The release layer is preferably formed as a monolayer and therefore its thickness is preferably on the order of ~2 nm, i.e., the dimensions of the molecules of the release layer material.

The following provides an example method for nanotemplate preparation and with a fused silica nanotemplate substrate. In a first step, the fused silica plate is cleaned, e.g., by an RCA cleaning, after which the substrate is spun dry, e.g., at about 2000 rpm for, e.g., about 60 s. After the first 15 s, $N_2$ can be blown onto the surface of the fused silica plate. A pattern layer is then applied to the nanotemplate substrate, e.g., by spin-coating (HSQ:MIBK) (1:1) on the fused silica plate. For a 120 nm-thick pattern layer, 5000 rpm spinning can be employed; for a 150 nm-thick pattern layer, 3000 rpm spinning can be employed. The applied pattern layer is then baked, e.g., at a temperature of about 90° C., for about 3 min on a hot plate or for about 1.5 hours in an oven.

At this point, the pattern layer is patterned with a selected nanotemplate geometry. For the example HSQ:MIBK pattern layer just described, an electron-beam lithography process can be employed for the patterning. It can be preferred to include an upper conductive layer, e.g., a 5 nm-thick layer of Al or Cr evaporated on the HSQ pattern layer, to prevent electrical charging during the electron beam lithography. The pattern layer is then exposed, e.g., with a RAITH 150 or other suitable electron beam lithography tool. This exposure step imposes a selected nanotemplate geometry on the pattern layer. If Al is employed as an anti-charging material, such can be removed during development of the pattern layer; otherwise, if, e.g., Cr is employed, such must be removed prior to pattern layer development. The pattern layer is developed, e.g., in MF-CD-26, at a temperature of, e.g., about 21° C. for about 1 h, or is exposed simply to room temperature ambient for 1 h. The layer is then rinsed with water and spun dry, e.g., at about 2000 rpm for about 60 s, with $N_2$ blowing if desired. The assembly is then baked on a hot plate, or in an oven, at a temperature of about 400° C. for about 1 h.

At this point, a release layer can be applied to the nanotemplate if desired. In one technique for applying a monolayer-thick release layer, first a drop of selected release layer material, e.g., $C_8H_4Cl_3F_{13}Si$, is put into a vacuum chamber by means of, e.g., a pipette. The template is then introduced into the vacuum chamber and the vacuum chamber is closed. The vacuum chamber is then pumped down for about 5 minutes, and the nanotemplate removed from the chamber. The nanotemplate, now including a release layer evaporated onto its surface, is then baked at a temperature of, e.g., about 90° C. for at least about 1 h. With this step, a nanotemplate having a substrate, a pattern layer, and a release layer is formed in accordance with the invention. With this process, stripping of the release and pattern layers, e.g., stripping of the Al layer, and cleaning of the substrate, enables reuse of the nanotemplate substrate for producing an entirely new nanotemplate geometry on the substrate.

In a second example recipe for producing a nanotemplate, a fused silica substrate is coated with a 150 nm-thick layer of PMMA employed as a lithographic masking layer for etching a nanotemplate feature into the substrate itself. Where electron beam lithography is to be carried out for lithographic patterning, in the manner described above, it can be preferred to provide a thin conductive film such as Al or Cr, or a conductive polymer, can be provided to suppress charging effects. A selected nanotemplate geometry is formed in the PMMA layer by, e.g., electron-beam lithography, with the layer developed in, e.g., 3:1 isopropyl alcohol:methyl isobutyl ketone for about 60 s.

Then a chrome layer, e.g., a 40 nm-thick chrome film is deposited on the developed PMMA by, e.g., electron-beam evaporation. The chrome layer is then patterned with the PMMA geometry, e.g., by a liftoff technique. With the chrome layer then employed as a hard etch mask, a nanotemplate geometry is then etched into the underlying substrate to a selected depth by, e.g., a $CF_4$ chemistry in a reactive ion etching (RIE) process. A release layer can then be added, if desired, to fluorinate the surface by vapor deposition of, e.g., tridecafluoro 1,1,2,2 tetrahydrooctyl thichlorosilane ($CF_3$—$(CF_2)_5$—$CH_2$—$CH_2$—$SiCl_3$) in the manner described in the example above.

In a further example of processes for producing nanotemplates to be employed in the NAIL process of the invention, periodic grating structures or other similar complex patterns are formed as the geometry of a nanotemplate. In one example process, a silicon substrate is employed as both the nanotemplate substrate and the nanotemplate pattern layer. For this scenario, for making, e.g., a periodic grating or other such structure with nanoscale features, e.g. having a grating period on the order of 100s of nanometers and grating depth on the order of 10s of nanometers, it can be preferred to form the nanotemplate geometry by, e.g., a combination of interference lithography and RIE.

In an example of such a process, a tri-layer resist process can be employed to minimize surface reflections in the interference lithography. An example suitable resist includes the layers of, e.g., a 200 nm-thick Sumitomo PFI-88 positive photoresist, followed by 40 nm-thick evaporated $SiO_2$, followed by a 400 nm-thick AZ Clariant BARLi-0.25 Anti-Reflective Coating (ARC). After exposure and wet development, three RIE steps can be employed to transfer a selected grating or other nanotemplate pattern into the silicon substrate: first a $CF_4$ RIE step can be employed to transfer the pattern into the silica interlayer, next an $O_2$ RIE step can be employed to etch the ARC and finally a $CF_4$ RIE step can be employed to etch the silicon substrate. Any remaining organic residue can be removed by, e.g., a 15 minute immersion in $H_2O:H_2O_2:NH_4OH$ solution in ratio 5:1:1 at a temperature of about 80° C., e.g., with the RCA cleaning procedure described above. With this step, the nanotemplate geometry is imposed on the silicon substrate. If desired, a release layer like that described above can be provided on the nanotemplate structure, following the procedure given previously.

In accordance with the invention, each nanotemplate substrate can be sized for a given application and/or apparatus to be employed for pressing the nanotemplate into an imprint layer in the manner described below. For example, a substrate can be diced or otherwise cut to a size that accommodates handling and takes into consideration the extent of the working area of an imprint layer. It is recognized that full-size microelectronic wafers and other substrates or support structures of similar size are particularly well-suited for ease of handling in the process of forming a nanotemplate; once formed, a nanotemplate substrate can then be sized appropriately for a given application.

In accordance with the invention there can be employed a super-template that mechanically supports a set of nanotemplates, where each nanotemplate is, e.g., one of the example nanotemplate geometries shown in FIG. 5. The super-template preferably accommodates a NAIL process such that during a given imprint step of a NAIL imprint sequence, only a selected one of the nanotemplates is brought into contact with an imprint layer at the desired location of pattern formation. The invention contemplates both planar super-template configurations as well as shaped super-templates as described in detail below. Whatever super-template geometry is selected, it is employed in the manner of a typewriter head, giving access to a set of nanotemplates that are together employed for producing a selected nanoimprint pattern.

In a first example of a super-template structure, an AFM tip is exploited as the super-template. Nanotemplates are provided on the AFM tip in a selected arrangement, in the manner described below. With such a configuration, by controllably tilting the AFM tip before pressing it down into an imprint layer during a given imprint step within a NAIL process, a single selected nanotemplate located on the AFM tip can be selectively and distinctly brought into physical contact with the imprint layer for making a desired impression in the layer.

FIGS. 6A-6C schematically illustrate this method for an example in which only a cross-section of an AFM tip is considered. In a first step, shown in FIG. 6A, it is desired to impress a selected nanotemplate 72 located on the AFM tip super-template 70 into an imprint layer 10 on a substrate 12. Two additional nanotemplates 74, 76 are provided on the cross-section of the super-template. The AFM tip super-template 70 is tilted such that the selected nanotemplate 72 can be impressed into the imprint layer 10 without the neighboring nanotemplates 74, 76 also making physical contact with the surface of the imprint layer in the vicinity of a pattern being formed.

Then as shown in FIG. 6B, the AFM tip 70 is tilted to align a second selected nanotemplate 74 for impression in the imprint layer 10. FIG. 6C illustrates a condition in which the AFM tip 70 is again rotated to align a third selected nanotemplate 76 for impression in the imprint layer 10. Note that each of the nanotemplates on the AFM tip super-template can be provided as a distinct geometric feature, and result in a corresponding distinct trench geometry in the imprint layer.

The curvature of the AFM tip and the height of the nanotemplates determine the nanotemplate spacing required to achieve the condition of FIGS. 6A-6C in which the imprint layer can be impressed with each nanotemplate in an isolated, separate manner. These variables set the requirement that a vertical space be provided between the surface of the imprint layer and the vertical projection of each nanotemplate that neighbors a nanotemplate currently being impressed into the imprint layer. This condition is shown in each of FIGS. 6A-6C, and is shown particularly clearly in FIG. 6B, in which there is proven to exist measurable vertical distances 78, 80 between neighboring nanotemplates and the imprint layer when the central nanotemplate 74 is employed a given imprinting step.

Figure 7A:
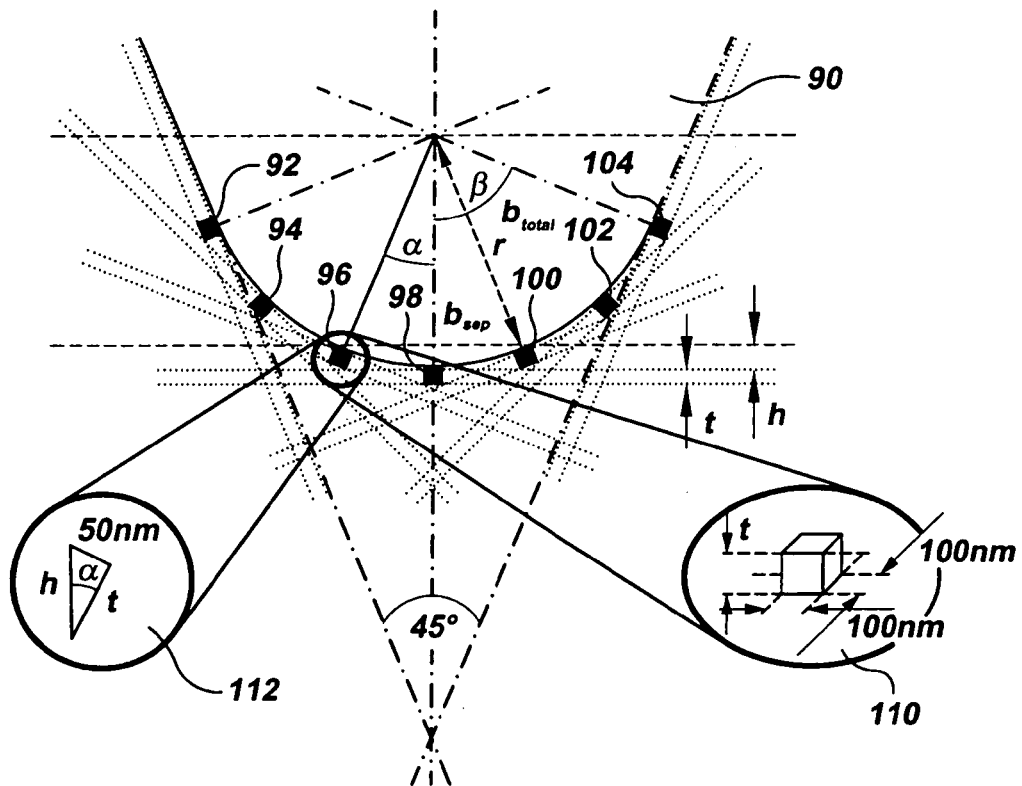
FIG. 7A is a schematic view of a profilometer-tip super-template in accordance with the invention, shown supporting a number of nanotemplates, identifying various geometric factors relating to nanotemplate spacing on the tip.

This condition can be quantified by considering a second super-template example, here that of a commercial stylus profiler tip, e.g., a Dektak tip from Veeco Instruments, Woodbury, N.Y. FIG. 7A is a schematic view of an example profilometer tip 90 configured as a super-template and including a number of nanotemplates 92, 94, 96, 98, 100, 102, 104. In this view and the corresponding discussion, only a cross-section of the profilometer tip is considered.

A calculation of the nanotemplate spacing that is required to enable single nanotemplate impression into an imprint layer can be made based on the assumption that a standard profilometer tip is employed having a tip radius, r, of 5 μM and a tip angle of 45°. Each distinct nanotemplate is approximated as a cube with dimensions 100 nm×100 nm, with a height, t, of 200 nm as shown in the inset 110 in FIG. 7A. The central question to be answered is how many nanotemplates can be disposed on the cross-section of the tip so that each nanotemplate can be used as an independent nanotemplate without neighboring nanotemplates touching the surface of the imprint polymer?

To make a quantitative assessment, referring to FIG. 7A, $b_{total}$ is defined as the total cross-section arc length of the tip that is available for supporting nanotemplates, and $b_{sep}$ is defined as the minimum cross-section arc length that separates two neighboring nanotemplates. As shown in the inset 112 in FIG. 7A, the angle α that corresponds with $b_{sep}$ can be given as:

$$\alpha = \arctan\frac{50\,\text{nm}}{200\,\text{nm}} \cong 0.25 \tag{1}$$

Then, as shown in the figure, $b_{total}/2$ can be correlated with the angle β=67.5° yielding a total arc length:

$$b_{total}=2r\beta(\text{rad})=2.5\,\mu\text{m}\cdot 1.1781 \cong 11.8\,\mu\text{m}. \tag{2}$$

As shown in FIG. 7A, $b_{sep}$ is defined based on the angle α=0.25 and hence:

$$b_{sep}=r\cdot\alpha(\text{rad})=5\,\mu\text{m}\cdot 0.25 \cong 1.25\,\mu\text{m}. \tag{3}$$

This leads to a total number of nanotemplates, $N_{nano}$, that can be distributed along the cross-section arc length, $b_{total}$, as:

$$N_{nano} = \frac{b_{total}}{b_{sep}} = \frac{11.8\,\mu\text{m}}{1.3\,\mu\text{m}} = 9.0769 \cong 9. \tag{4}$$

Hence based on the initial assumption of nanotemplate approximated by a cube with the dimensions given above, nine nanotemplates can be attached along the cross-section of a profilometer tip. This calculation is two-dimensional in nature, being limited to a cross section of the tip, and thus can be projected on the full three-dimensions of the tip. Such a projection would indicate that the total number of nanotemplates that can be supported around a tip $N_{nano/tip}$ is significantly larger than $N_{nano}$. For example, far more than all sample nanotemplates illustrated in FIG. 5 would fit onto a super-template profilometer tip. As a result, it is found that a rounded super-template structure, such as a profilometer tip or an AFM tip, are well-suited for the NAIL process of the invention.

This calculation can be extended to a configuration in which each nanotemplate is given as a 10 nm×10 nm×50 nm cube, where the height, t, of the cube is 50 nm. The calculations above are then adjusted for this shorter nanotemplate as:

$$\alpha = \arctan\frac{5\,\text{nm}}{50\,\text{nm}} = \arctan 0.1 \cong 0.0997. \tag{5}$$

As can be observed from FIG. 7A, $b_{sep}$ can be defined with the angle α=0.0997, giving:

$$b_{sep}=r\cdot\alpha(\text{rad})=5\,\mu\text{m}\cdot 0.0997 \cong 0.5\,\mu\text{m}. \tag{6}$$

Because $b_{total}$=const.=11.8 μm the total number of nanotemplates $N_{nano}$ that can be distributed along the cross-section arc length $b_{total}$ can be given as:

$$N_{nano} = \frac{b_{total}}{b_{sep}} = \frac{11.8\,\mu m}{0.5\,\mu m} = 23.6 \cong 23. \quad (7)$$

Hence based on these assumptions, a maximum number of 23 nanotemplates, each 10 nm×10 nm×50 nm, can be attached along the cross-section of the super-template profilometer tip. This result is consistent with the expectation that significantly more nanotemplates fit on the same tip if the feature sizes of the nanotemplates are decreased.

The invention contemplates a range of super-template geometries and structures. For example, the super-template can be planar, rather than curved. In this case, the super-template is translated, rather than tilted (in the case of a curved super-template) to align a selected nanotemplate with a location in an imprint layer to be processed. In general, planar super-template geometries require that the supported nanotemplates be sufficiently spaced apart so that when a selected nanotemplate is impressed into an imprint layer, surrounding nanotemplates on the super-template do not also make contact with the imprint layer. This requires that each nanotemplate be laterally isolated by an amount that corresponds to the working area of an imprint layer being processed.

Figure 7B:
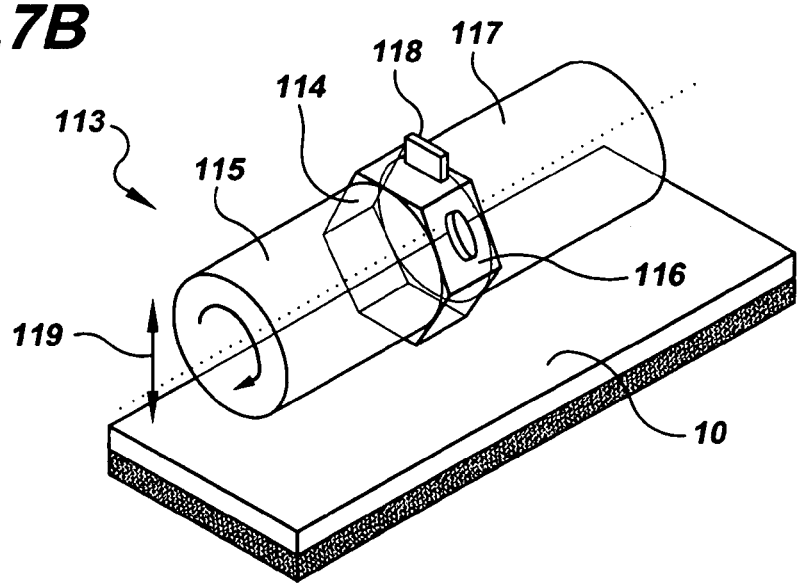
FIG. 7B is a schematic view of a super-template structure provided by the invention including both planar and curved structural elements.

The invention also provides for combination super-template geometries, e.g., planar super-template structures superimposed on a curved super-template structure. FIG. 7B is a schematic view of such a combination super-template 113. Here a hexagonal prism super-template support structure 114 is mounted between two cylindrical mounting elements 115, 117. The mounting elements and prismatic support structure are preferably configured as one unit, such that each cannot move with respect to the other. The prismatic support structure has a point-symmetric polygon base. This base structure enables mounting elements to be configured such that the whole assembly can be rotated around an axis that is parallel to the surface plane of an imprint layer 10 to be imprinted.

As shown in FIG. 7B, the example super-template 113 supports up to six nanotemplates. Two of such nanotemplates, namely a circular-geometry nanotemplate 116 and a rectangular-geometry nanotemplate 118, are shown in the figure. In the example arrangement of FIG. 7B, there is one single nanotemplate provided on each of the six surfaces of the prism 114. With this configuration, six angles, $\theta_n = n \times 60°$, where n=1, 2, . . . , 6, each correspond to a prespecified position of the super-template prism 114 for which the selective imprinting of a particular nanotemplate into the imprint layer can be carried out.

In operation, for impression with a selected nanotemplate, the super-template assembly 113 is moved vertically 119 to be pressed down into the imprint layer 10. Then when lifted from an imprint layer, the assembly can optionally be rotated to position a different selected surface of the prism and its corresponding nanotemplate in a plane that is parallel with the imprint layer 10. Between imprint steps, the imprint layer can be adjusted laterally. This combination super-template structure thereby enables ease of selection and positioning of nanotemplates in combination with lateral adjustment of the imprint layer.

Other super-template geometries can be employed as suited for a given application. In addition, super-template structures can be configured in arrangements of such structures. For example, an array of super-templates can be configured. In one such arrangement, AFM tip super-templates are configured in an array and each can be moved up and down with respect to the other tips in the array, thereby providing a library of super-templates and their nanotemplates.

Having demonstrated that super-template geometries and arrangements are provided for accommodating a practical set of nanotemplates in such a manner that each nanotemplate can be individually employed, the invention provides a range of techniques for forming nanotemplates on a super-template. In a first example technique, individual nanotemplates can be individually produced, sized and then manually affixed to the super-template, e.g., by conventional attachment means and techniques, including, e.g., epoxies or other suitable attachment materials or mechanisms, such as anodic bonding or fusion bonding.

In an alternative technique, a selected set of nanotemplate geometries can be produced serially or in parallel directly on the super-template, forming a permanent arrangement of nanotemplates on the super-template. Where the super-template is of a planar geometry, the example processes described above for forming a nanotemplate can be directly applied for forming nanotemplate geometries on the super-template material. Here the super-template acts as the substrate for each nanotemplate, and can include pattern and release layers for each nanotemplate if desired. For this condition, particularly well-suited super-template materials include, e.g., silicon and quartz. Quartz can be preferable for many applications because if its characteristic optical transparency, which enables optical monitoring with visible light in situ, during an imprinting step. Quartz additionally provides the anti-sticking and durability characteristics of silicon. The silicon, quartz, or other super-template material can be coated, e.g., silicon coated with $SiO_2$ or other selected material. In general, a material having a surface that is easily fluorinated, e.g., Si, and $SiO_2$, is beneficial for minimizing adhesion. Hardened polymers, such as PMMA, can also be employed.

Where a selected super-template geometry is not planar and is, e.g., curved, as in the case of an AFM tip, profilometer tip, stylus, or other geometry, the invention provides techniques for producing nanotemplate geometries on the curved super-template. For curved super-template structures, diamond, silicon nitride, silicon coated with cobalt, chrome, or iron, carbon, or carbon nanotubes can be preferred as a super-template material. In a first example technique for producing nanotemplate geometries on a curved super-template, Focused Ion Beam (FIB) Induced Deposition and FIB-based micromachining are employed to form nanotemplate geometries in a curved super-template. Considering the example of a silicon AFM tip super-template, the AFM tip is mounted in a FIBL system, and then the tip is locally milled by means of FIB to form a number of locally planar areas on the tip surface. Each planar area corresponds to one nanotemplate and is located at a tip region selected for that nanotemplate.

To form each nanotemplate geometry, first tungsten is blanket-deposited on each planar region, e.g., by FIB-induced deposition, and then FIB-based micromachining is carried out to mill the tungsten layer and the underlying silicon tip, cutting an arbitrarily selected nanotemplate geometry out off the silicon/tungsten plane in a selected nanotemplate location. The tungsten acts as micromachining hard mask during the tip milling, enabling the generation of sharp geometric edges for each silicon nanotemplate feature. With a nanotemplate geometry complete, then the residual tungsten is stripped off the tip surface. This procedure can be repeated at different locations of the AFM tip as necessary to complete formation of a set of nanotemplates, each time adding an additional nanotemplate to the surface of the AFM tip.

Figure 8A:
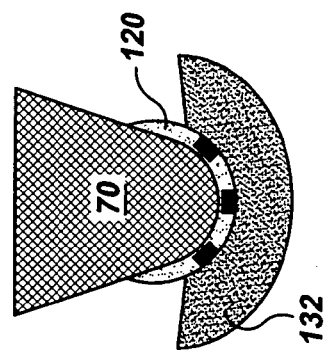
FIGS. 8A-8C are schematic views of example patterning processes provided by the invention for producing nanotemplate geometries on an AFM tip super-template.
Figure 8B:
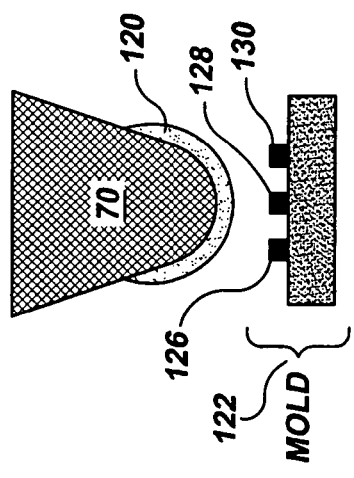
Figure 8C:
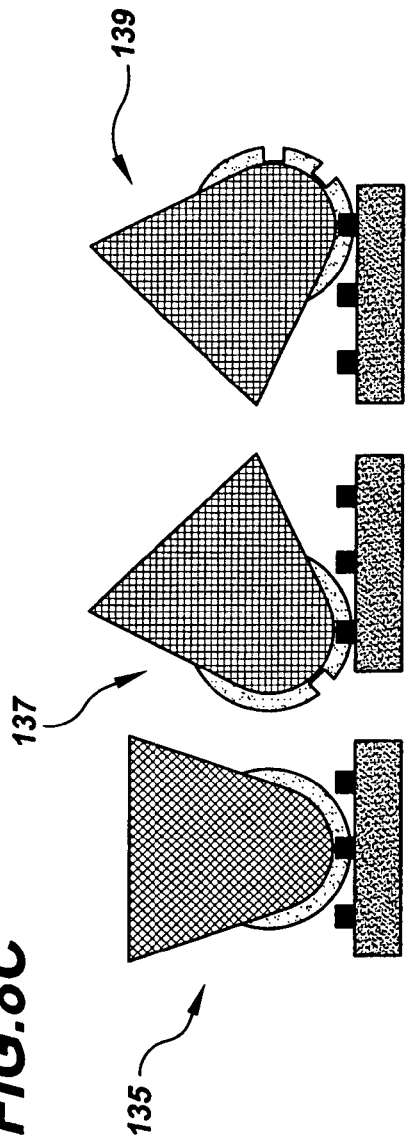

Another technique provided by the invention for generating nanotemplate features on the surface of an AFM tip is direct thermal nanoimprint lithography, or preferably, room-temperature nanoimprint lithography. Referring to FIGS. 8A-8C, in this process, the surface area of the AFM tip 70 that is to be patterned with nanotemplates is first coated with an imprint polymer layer 120, preferably using a NAIL compatible imprint polymer such as those described previously, as shown in FIG. 8A. An imprint mold 122 providing rigid nanotemplate geometries 126, 128, 130 that are to be imprinted into the surface of the AFM tip is generated by means of the various template fabrication techniques described earlier. While FIG. 8A represents three nanotemplate geometries that are identical, such is for clarity only; it is to be recognized that each geometry of the mold can be distinct.

There are principally two different kinds of substrates that can be employed for fabricating the imprint mold 122, namely, flexible substrates and rigid substrates. "Flexible" molds are formed of materials, such as PDMS, that accommodate a process in which pressing of a polymer-coated AFM tip against the imprint mold causes a deformation of the imprint mold while the coated AFM tip remains undeformed except for the imprint polymer layer being imprinted by the features on the mold. FIG. 8B illustrates this condition; here the AFM tip 70 is pressed against the mold with the mold now in a deformed condition 132, enabling impression of all of the mold nanotemplate features into the polymer layer 120 on the tip. As a result, only one imprint step is required to imprint all the nanotemplates into the imprint polymer layer.

"Rigid" molds are not deformed when the polymer-coated AFM tip is pressed against the mold and thus are formed of materials such as silicon or silicon dioxide. As shown in FIG. 8C, for this case, the AFM tip is tilted and/or rotated before each nanotemplate is printed into the imprint polymer layer on the AFM tip. FIG. 8C illustrates a first 135, second 137, and third 139 cycle of this process for making nanotemplate geometric impressions in the polymer layer 120. This repetition ensures that each nanotemplate can fully be brought into physical contact with the imprint polymer layer independent of other nanotemplates.

Whatever type of mold is employed, after the release of the mold the imprint polymer layer on the AFM tip can be cured if necessary, e.g., if a room temperature polymer is not used. Any suitable curing method can be employed, for example, exposure to selected radiation, such as UV-exposure, or cooling from an imprint temperature to a lower temperature. With the polymer layer cured, the imprinted nanotemplate geometries in the polymer layer are then transferred into the surface of the AFM tip. Etch processes, such as wet etching, e.g., anisotropic etching, or dry etching, e.g., plasma etching, can be employed for etching the nanotemplate geometries into the AFM tip. Once the patterning of the tip is complete, residual imprint polymer on the tip can then be stripped off the tip surface. In an alternative process, the nanotemplate geometries are not transferred into the AFM tip and instead the imprinted layer on the tip is employed to provide the nanotemplate features. The NAIL super-template is then complete.

The invention provides specific apparatus for the control and motion of nanotemplates and super-templates in carrying out a NAIL process. FIG. 9 provides a schematic view of one example mechanical system 140 for carrying out the NAIL process. Under selected and controllable conditions, this system can enable accuracy in alignment between multiple sequential NAIL imprint steps to about 400 nm and as low as 80 nm or less.

The NAIL processing system 140 includes a substrate holder 142, e.g., a wafer chuck that is mounted to a linear x, y, z translation stage. The stage is preferably driven by computer-controlled stepper motors. A heater 146 can be included if heating of the substrate is desired. A conventional vacuum pump can be employed to mechanically rigidly support the substrate on the optionally-heated sample holder-chuck arrangement.

The translation stage is a three-axis stage having, e.g., a z-stage 146 mounted to a bottom sliding plate 148 to move all components on top of the z-stage up and down in the z-direction, where the x, y, and z directions are defined in the figure. An x-stage 150 is provided to move all components on top of the x-stage in the x-direction, and a y-stage 152 is provided to move all stage components that sit on top of it back and forth in y-direction. Preferably, the x-stage, y-stage, and z-stage are moved by, e.g., computer-controlled motor activators, such as DC stepper drives 154. To optimize process resolution, it can be preferred that the stepper drives be characterized with micrometer resolution. Additionally, the x-stage and the y-stage can be fine-tuned by, e.g., piezoelectric motion controllers 156 that preferably are capable of sub-10-nm resolution. A rotation stage 157 is included for enabling rotation of the imprint layer between steps of a NAIL process. The rotation stage can be exclusively controlled by the piezoelectric motion controllers 156.

As explained above, a heater 146 can be included for heating the wafer chuck if the selected imprint layer material requires such. If the imprint layer need not be heated, then the heating system need not be included or can be inactivated. Optionally, heat sensors 158 can be provided in the wafer chuck 142 to monitor and control the temperature at the interface between a substrate and the chuck. Additionally, capacitive sensor plates 160 can be attached to the surface of the chuck and together with counterpart sensor plates provided on the bottom side of the nanotemplate or super-template holder 162 the capacitive sensors enable control of the width of the gap between a nanotemplate and an imprint layer. It is recognized that gap sensing techniques other than capacitive techniques can here also be employed. The holder 162 is preferably a rigid frame that can be adapted to support a nanotemplate to be employed for a NAIL process or that can be adapted to support a planar super-template 163 providing a set of nanotemplates in the manner described above.

The NAIL system 140 can be disposed on, e.g., an optical table 164. Because only relative movement between a nanotemplate or super-template and an imprint layer is necessary, in one example, the system maintains fixed the position of the nanotemplate or planar super-template, and the substrate providing an imprint layer to be processed is moved by the x-y-z stage. Where a nanotemplate is employed, such can be glued or otherwise affixed to, e.g., a substrate such as a silica substrate and the substrate mounted in the holder 162. A planar super-template 163 can be directly mounted in the holder 162. In either case, the nanotemplate features are oriented with the imprint layer to face each other.

A light source, e.g., a narrow-band green light source 166 can be included if desired, to enable observation of optical fringes between the bottom surface of a nanotemplate or super-template and the top surface of a substrate to be processed. The fringes can be used in the conventional manner to determine the variation in spacing between two surfaces. With this information, the surfaces can be aligned to be parallel. To this end, tilt stages 168, 169 can be included that enable adjustment of the tilt of the chuck. It can be preferred to ensure that a nanotemplate or super-template surface and an imprint layer surface be nearly perfectly leveled in order to avoid shear forces during an imprint step, which can reduce alignment accuracy and even destroy a nanotemplate.

During a NAIL process, the light source 166 is preferably removed so that an optical microscope 168 with a long-working-distance objective can be employed to image imprinted geometric trenches in an imprint layer. For this application, it is required that the nanotemplate or super-template be transparent so that the microscope can be focused through the nanotemplate or super-template. It is recognized that infrared light, visible light, X-rays, or other radiation to which the substrate or nanotemplate or super-template are transparent can be used to image the imprint layer. It is further recognized that microscopy techniques such as differential interference contrast microscopy or confocal microscopy can be used to enhance the image contrast. The microscope 168 can be connected to, e.g., a charged coupled device (CCD) camera 170 and a display 172. This configuration enables a feedback loop that can enforce a significant degree of alignment. If desired, during a NAIL process data from the motion controllers and piezoelectric controllers can be continuously analyzed and processed by a computer that can be programmed to signal movement of the stages according to a prespecified sequence of NAIL imprint steps to be carried out for a given NAIL process.

In an effort to decrease misalignment, a number of nanotemplate geometries provided on a planar super-template can be designated as alignment marks that are imprinted into an imprint layer during each imprint step of the NAIL process. After carrying out a complete NAIL cycle and removing the imprinted sample from the system, the position of the imprinted alignment marks can be measured by, e.g., SEM and/or AFM. By comparing the actual positions of the impressed marks with their designated calculated positions as laid out by, e.g., a computer program controlling the stage, there can be determined constant x- and y-misalignment resulting from, e.g., non-linearities in the voltage-motion characteristics of motor actuators and/or piezo actuators. With this information, when a new NAIL process is to be carried out with a new nanotemplate or super-template, the piezo/motor actuators can be calibrated to correct any misalignment.

Figure 10:
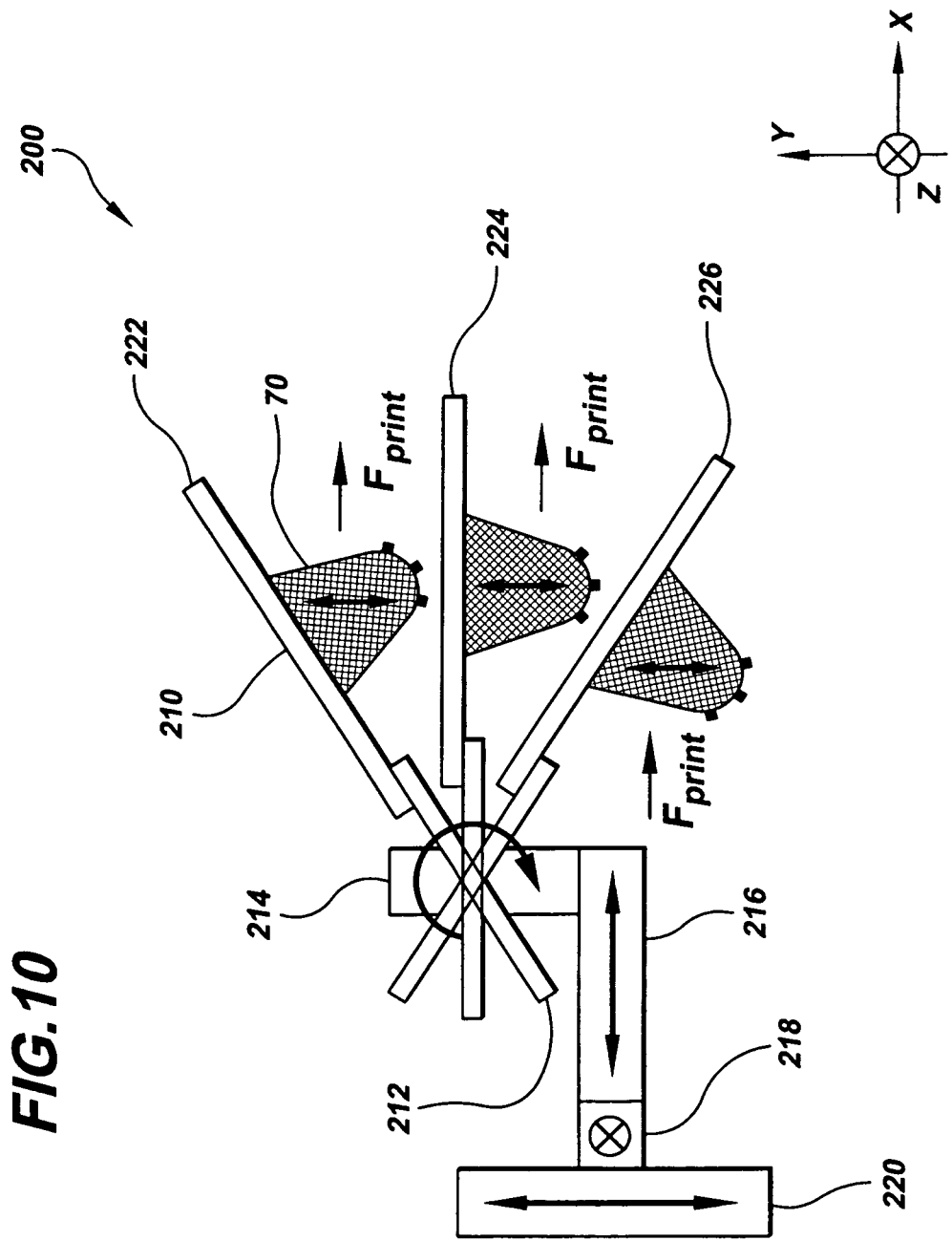
FIG. 10 is a schematic view of a mechanical control system provided by the invention for carrying out a nanotemplate arbitrary-imprint lithography process of the invention with an AFM super-template.

The invention further provides positioning and control systems for non-planar super-template operation, for example employing an AFM tip super-template or a profilometer stylus tip. FIG. 10 is a schematic view of an example position and control system 200 for an AFM tip super-template, but this configuration can be adapted also for controlling a stylus tip or other curved super-template structure. There is exactly one characteristic spatial position of the AFM super-template that enables a NAIL impression with a given nanotemplate on the tip. Therefore, for each imprint step of a NAIL process the AFM tip is controllably fixed to align the specific spatial position of a selected nanotemplate to be impressed with an imprint layer. In the example AFM control system 200 of FIG. 10, the imprint position required for a nanotemplate is controlled by controlling the vertical tilt angle of a lever 210 that carries the AFM tip super-template 70.

In the control system, the AFM tip super-template 70 is mounted on a tip lever 210 that is in turn mounted on a lever mount 212. The tip lever 210, NAIL super-template 70, and lever mount 212 form a tip unit. This tip-unit is mounted on a piezoelectric actuator 214 that allows the tip-unit to be rotated in the x-y-plane. This rotation can be imposed with automatic piezoelectric actuator control and/or by manual adjustment. Two lateral AFM piezoelectric actuators 216, 218 enable positioning of the rotation actuator 214, and hence the tip unit itself, in the x-z plane. The lateral actuators 216, 218, rotation actuator 214, and tip unit form a stamp unit. Vertical AFM piezoelectric actuators 220 are provided for moving the stamp unit in y-direction.

FIG. 10 illustrates three separate NAIL impression steps at which the AFM tip-unit is adjusted at three different tilt angles labeled 222, 224, and 226. Each position enables a single imprint step or a sequence of imprint steps with one selected nanotemplate. After the tip-unit is adjusted to a desired position, the lateral piezo-actuators 216, 218 drive the tip-unit to the position where the next imprint step should be performed. The actual imprinting is then initiated by the vertical piezo-actuator 220. As can be recognized, this sequence of steps can be performed in another suitable order; for example, the tip unit can first be driven to a position of imprint and then adjusted to a selected nanotemplate position. In either case, the direction of the corresponding imprint force, $F_{print}$, acting on the NAIL super-template as well as on the nanotemplate is indicated by the arrows for every imprint position. An arbitrary motion sequence of the lateral piezo-actuators and the vertical piezo-actuator allows for performing imprint sequences with the same nanotemplate as well single imprint steps with different nanotemplates.

In this imprinting process just described, the AFM tip unit is moved relative to an imprint layer material. In accordance with the invention, a holder supporting a substrate to be imprinted can instead be moved relative to the AFM tip unit. For example, lateral piezo-actuators 216, 218 can be employed to move a substrate holder. Similarly, the substrate holder can be moved vertically relative to the AFM tip unit rather than movement of the AFM tip unit vertically. The invention does not require that a particular one of the elements be moved, but rather, that relative positioning between the tip and imprint layer be controlled.

The example system of FIG. 10 is specific to the condition in which a set of nanotemplates are arranged along one cross-sectional arc of the NAIL super-template that is parallel to the x-y plane. To address nanotemplates disposed on other surface areas of the NAIL super-template, the NAIL super-template is rotated in the x-z plane. As explained in detail below, where this rotation is not easily implemented, it can be preferred instead to employ multiple AFM systems between which a substrate having an imprint layer is moved, with each AFM system providing a subset of nanotemplates to be employed for a given NAIL process.

Considering now techniques for controlling AFM super-template operation in a NAIL process, it is recognized that to a great extent the achievable NAIL process imprint rate is determined by the amount of time that is necessary to control the motion and the spatial adjustment of nanotemplates on a super-template between sequential imprint steps of a NAIL process. An AFM tip super-template is particularly well-suited for minimizing this required time because an AFM is capable of acting in two complementary modes, namely, an imaging mode and a patterning mode. During the time that an AFM tip super-template is not in physical contact with the surface of an imprint layer the AFM can be operated in imaging mode, and while in patterning mode the AFM tip can be pressed against the imprint layer by applying a force that is strong enough to imprint nanotemplates into the imprint layer. After a selected imprint depth is reached the AFM tip and hence a nanotemplate can be released from an imprinted area and subsequent imprint steps can be initiated, with the AFM carrying out imaging mode operations between each step. The AFM enables efficient switching between imprint and imaging operations, thereby to maximize throughput of the NAIL process. In accordance with the invention, this capability is exploited to enable, at each step of a NAIL process, the switching of the AFM back and forth between the imaging mode and the patterning mode as necessary.

With this consideration, an AFM tip super-template can be controlled by computer analysis where a selected pattern to be imprinted by the NAIL process is specified in a computer pattern file. This pattern file can be analyzed to identify for each nanotemplate the imprint layer positions at which the nanotemplate is to be impressed, and the number of times that nanotemplate is to be employed in a given NAIL process. With this knowledge, there can be calculated, e.g., by computer, a preferred position, on an imprint layer, for one or more selected alignment geometries relative to the position of each nanotemplate imprint step in a NAIL process. In one example, the alignment marks are homogeneously distributed along the edges of a final desired pattern, with approximately equal spacing between the marks. The impressed pattern can alternatively itself be employed as alignment mark grid during the steps of a NAIL process.

With such alignment marks and their preferred impression locations specified, the NAIL process can be initiated with an AFM super-template by first impressing the alignment marks on the imprint layer. These alignment marks can be imposed on the imprint layer by the NAIL process and a set of individual nanotemplates, by a planar super-template, or by other non-NAIL process, e.g., e-beam lithography and subsequent etching, classical imprint technology, or other suitable technique to generate some topographical change in the surface of the imprint layer. The precision accuracy of the alignment marks is preferably significantly better than the resolution of the final desired pattern. For example, if the smallest features in the final desired pattern are in the range of 100 nm, then the alignment mark positioning accuracy is preferably in the range of sub-10-nm.

With the set of alignment marks transferred to the imprint layer, the AFM can then be controlled in its imaging mode to "read" the actual positions of the alignment marks in the imprint layer. This indication of the actual alignment mark positioning enables compensation for mismatches between the actual positions of the alignment marks with their calculated positions. The corrected positions of the alignment marks can then be used as reference data by a computer-controlled motion control unit of the NAIL super-template such as the AFM tip super-template. Possible non-linearities in the voltage-motion characteristics of the piezo-actuators used for moving the AFM tip and/or the stage during the NAIL process can further be compensated for based on the positions of previously imprinted nanotemplate geometric trenches and alignment marks during the NAIL cycle. As explained previously, this feedback calibration based on alignment marks can be employed for planar nanotemplate and planar super-template applications as well as AFM or other curved super-template structure.

Where an AFM super-template is employed, once the alignment marks on an imprint layer are read in the AFM imaging mode, the AFM is then controlled in patterning mode to nanoimprint the specified imprint pattern. There are two example control techniques that can be employed for this imprinting sequence. In a first technique, the computer pattern file specifying nanotemplate is sorted so that the NAIL imprint sequence imprints the final desired pattern column after column or line after line of AFM control until the NAIL process is complete. In this scenario, the direction of motion of the AFM lever with the NAIL super-template is strictly linear to a great extent. This is an advantageous condition in that it is understood that it is desirable to change the direction of motion of the super-template during sequential imprint steps as little as possible such that misalignment is minimized. However, this scanning-type NAIL process requires that the AFM tip be adjusted precisely at a different angle each time a different nanotemplate is needed for a next sequential imprint in the scan. As a result, this method can be quite time consuming and reduce the overall achievable NAIL imprint rate.

In a second AFM patterning mode control technique in accordance with the invention, the computer file of pattern geometries is sorted with all instances of each nanotemplate to be used in a NAIL process grouped together. Then in operation, the AFM is controlled to imprint across an imprint layer all instances of a given nanotemplate needed for a final pattern before adjusting the AFM tip position to imprint a different nanotemplate geometry. This procedure is repeated for all nanotemplates that have to be used to print out the final desired pattern and until the NAIL cycle is complete. This second control technique has the advantage of maximizing the precision of sequential imprint steps employing a common nanotemplate because there is no need to adjust the AFM super-template tip tilt angle between those imprint steps. It is recognized, however, that this precision is also a function of the accuracy of the motion control of the AFM tip in x-y direction, as well as the correctness in knowledge of and the actual position of each nanotemplate on the super-template.

Whichever AFM control technique is employed, it can be preferred for some applications to switch the AFM between imaging mode and patterning mode between every imprint step to determine the actual position of a nanotemplate that has been used based on the trench topology of the pattern currently existing in an imprint layer. An AFM is extremely well-suited for this procedure because it can switch between the so called zero-force point, which is the working regime of the AFM in its imaging mode, and the maximum-force point, which is the working regime of the AFM in its patterning mode, very quickly, and thus can obtain this data without noticeably degrading the NAIL imprint rate. Thus, the AFM can be switched between imaging mode and patterning mode at selected NAIL process steps to update reference data based on the previously printed regions of a final desired pattern, to enable increase in accuracy in subsequent NAIL process steps.

In accordance with the invention, instead of a single AFM super-template, a nanotemplate set can be distributed onto several AFM tip super-templates. In this scenario, a substrate carrying an imprint layer to be patterned may need to be moved from one AFM to the next AFM between sequential imprint steps of a NAIL process. The imaging capabilities of the AFM here are particularly important; an AFM can be caused to "read" the topology of the previously printed pattern in its imaging mode before that AFM begins one or more imprint steps. This control technique can achieve a maximized AFM tilt accuracy for each AFM tip employed in a NAIL process when only one nanotemplate is provided on each AFM tip, whereby each super-template includes only one nanotemplate.

Whatever NAIL process control is implemented, whether with an AFM super-template, a planar super-template, or a set of nanotemplates, once a NAIL process is complete and a final desired imprint pattern or final desired imprint patterns have been formed in an imprint layer on a substrate, any residual imprint layer material remaining at the bottom of trench geometries can be removed, if desired, and then the imprinted pattern can be transferred into the substrate or an underlying layer provided on the substrate.

Figure 11A:
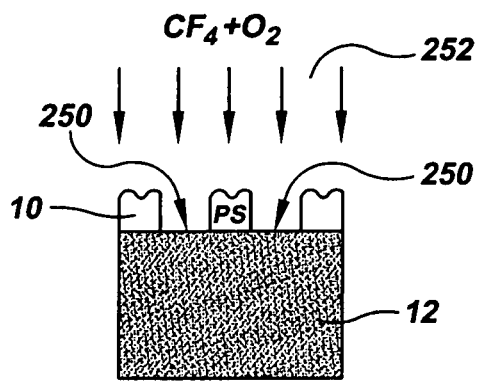
FIGS. 11A-11D are schematic views of processing steps provided by the invention for transferring to a substrate a pattern produced in an imprint layer by the nanotemplate arbitrary-imprint lithography process of the invention.

Steps of an example method for carrying out this process are schematically shown in FIGS. 11A-11D. In the example of FIG. 11, the imprint layer 10 is given as PS and the substrate 12 is given as silicon. As shown in FIG. 11A, there exists a residual layer 250 of PS at the bottom of geometric trenches in the PS layer 10. This residual material can be removed, if desired, by any suitable process, e.g., with a plasma etch process 252 employing a $CF_4$ and $O_2$ chemistry as shown in the figure. In general, the residual material can be removed by, e.g., reactive ion etching; wet chemical etching; or subjecting the imprint polymer layer to an environment comprising an argon ion stream, an oxygen-containing plasma, a reactive ion etch gas, a halogenated-containing gas, a sulfur dioxide-containing gas, or combinations thereof. It can be preferred to use oxygen plasma for removing compressed PMMA from the bottom of imprinted trenches.

Figure 11B:
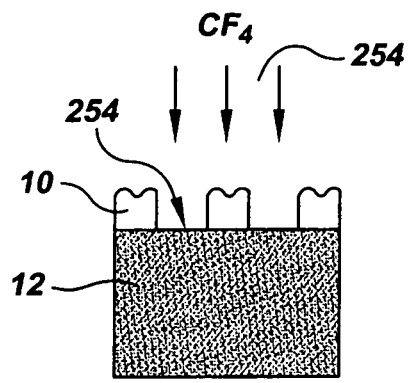
Figure 11C:
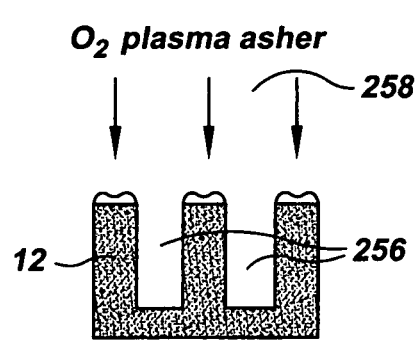

FIG. 11B illustrates the condition in which a plasma etch process has fully removed the residual material such that the surface 254 of the underlying substrate 12 is exposed at the bottom of trenches in the PS layer 10. With this condition, the trench pattern can then be transferred to the silicon substrate. As shown in FIG. 11B, in one example process, a plasma etch process 254 employing a $CF_4$ chemistry can be carried out to etch the silicon substrate 12. With the silicon substrate 12 thusly etched, as shown in FIG. 11C, with trenches 256 now formed in the substrate, residual imprint material can be removed from the substrate surface.

Figure 11D:
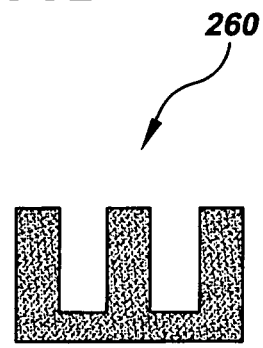

This imprint layer removal can be carried out by, e.g., RCA cleaning, reactive ion etching, wet chemical etching, or the other processing described above for removal of imprint material from the bottom of trenches in the imprint layer. In one example, shown in FIG. 11C, an oxygen plasma ashing process 258 can be employed to remove residual imprint layer. Then, as shown in FIG. 11D, with the imprint layer completely removed, a patterned substrate 260 is produced replicating the pattern imprinted by the NAIL process of the invention in the imprint layer.

EXAMPLE

Figure 12:
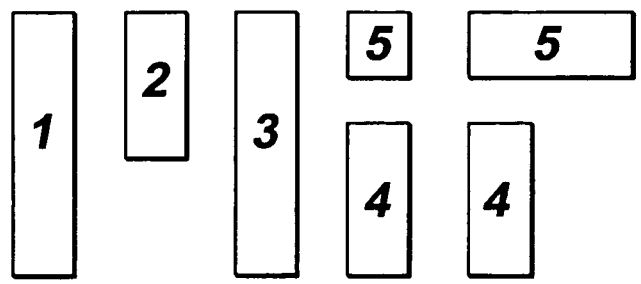
FIG. 12 is a representation of a super-template geometry employed in an experimental example of the nanotemplate arbitrary-imprint lithography process of the invention.

A multi-step NAIL process was carried out for imprinting a complex pattern using a planar super-template. The super-template consisted of a variety of rectangular geometries, each of which constituted a distinct nanotemplate, arrayed across the super-template in a pattern designed specifically for imprinting a selected pattern, such that a total of five imprint steps were required. FIG. 12 is a graphical representation of the final desired imprint pattern, with the number in each rectangular feature indicating the order in which the corresponding nanotemplate was imprinted. The nanotemplate structures on the super-template consisted of the six rectangles and one square shown in the figure that together make up the pattern. Note that the fourth and fifth nanotemplate geometries each included two distinct and separated features. On the planar super-template, each nanotemplate geometry was vertically displaced from the others by a distance of 2.5 μm. With this arrangement, to form one complete pattern, it was required to translate the super-template along the y-axis by 2.5 μm between the five imprint steps.

The super-template was fabricated using 30 KeV electron-beam lithography to define the rectangular nanotemplate structures in a pattern layer of 950 Kg/mol PMMA spun to a thickness of 150 nm on a 3.81 cm-diameter fused silica parallel window substrate from CVI Laser, Covina, Calif. (PW1-1525-UV). A thin layer of conductive film, aquaSAVE, from Mitsubishi Rayon, New York, N.Y.) was spin-coated onto the PMMA pattern layer to prevent charging during electron-beam lithography. The super-template was developed in a solution of 3:1 isopropyl alcohol:methyl iso-butyl ketone for 60 s. Then 40 nm of chrome was deposited using electron-beam evaporation and patterned by using liftoff. With chrome as the etch mask, the nanotemplate structures were etched into the pattern layer to a depth of 270 nm by $CF_4$ RIE. A surface release layer was then formed by vapor deposition of tridecafluoro 1,1,2,2 tetrahydrooctyl thichlorosilane ($CF_3$—$(CF_2)_5$—$CH_2$—$CH_2$—$SiCl_3$) from Gelest, Inc., Philadelphia, Pa., in the vacuum deposition manner described previously. Several super-templates were fabricated, having nanotemplate features of varying aspect ratios, comprising linewidths ranging from 150 to 300 nm wide.

The imprint layer was provided as a spin-coated, 330 nm-thick PS layer on a silicon substrate. PS, from H.W. Sands Corp., Jupiter, Fla., with an average molecular weight of 97 kg/mol was first dissolved in toluene to a concentration of 5% by weight. The resulting PS/toluene solution was spin-coated onto a silicon wafer at 2500 rpm and baked at 120° C. for 2 minutes resulting in a 330 nm-thick PS imprint layer on the silicon substrate.

This substrate was loaded onto the tool of FIG. 9 and super-template and substrate surfaces were then leveled. Imprints were performed by driving the z-stage to a stop into the super-template. Because the total area to be imprinted in formation of the pattern in the PS layer was small, 3.5 $mm^2$, the force applied by driving the z-stage into the mold was sufficient to imprint the rectangular structures.

A single NAIL process was carried out with a total of ten imprint steps to sequentially form six replications of the pattern of FIG. 12 of different sizes, down to linewidths of imprinted nanotemplates of ~150 nm. A 5-nm-thick Au/Pd layer was deposited on the patterned PS layer to enable SEM imaging of the patterns. The imprinted patterns were found to be partially distorted. In contrast, isolated features that were not in the proximity of subsequently imprinted features did not show evidence of distortion. The observed vertical and horizontal misalignment was between about 80 nm and about 380 nm.

The patterns formed in the PS imprint layer were transferred to the underlying silicon substrate. First a combined $CF_4$ and $O_2$ RIE step was carried out for 4 min to etch down the PS layer everywhere until all residual PS was removed from the bottom areas of the imprinted trenches. In order to prevent the imprint layer from heating up and losing its imprinted shape during the RIE process, this etching step was separated into two subsequent 2 min-long etching steps that also removed the ~5 nm thick Au/Pd coating on the layer. This two-step etching process minimized heating of the PS to ensure that the PS did not flow back into the imprinted trenches during the etch process.

As explained previously, the NAIL process is a volume preserving patterning process, thus causing imprint layer material to be pushed away from imprinted trench features in the imprint layer, forming raised deformations at the edges of imprinted features, with an average height of 40 nm. It is understood that this imprint layer distortion, as well as deformation and the imprint depth, are dependent on characteristics of a particular imprint material, the imprint time of a single imprint step, and the shape of the nanotemplates. Any deformations in the imprint layer are preferably not transferred into the silicon. To achieve this condition, the $CF_4$ RIE was halted before the remaining PS layer in the non-imprinted region had cleared after three subsequent 2 min-long steps. The etch rate of the $CF_4/O_2$ RIE for PS was ~40 nm/min and the etch rate of $CF_4$ for silicon was ~25 nm/min. This enabled etching of the pattern to a depth of about 100 nm into the silicon substrate. Finally the residual PS patterns material was stripped off in an O₂ plasma asher for 5 min. With this last step, the silicon substrate was found to have been successfully patterned.

Considering the speed of this NAIL process based on the experimental results, it was found that time required for one imprint, $\Delta t_{imp\text{-}one}$, was between 1-10 seconds when using PS with a molecular weight of 97.4 kg/mol as the imprint layer material. If the time necessary for releasing a NAIL nanotemplate and bringing a next sequential NAIL nanotemplate into position above the imprint polymer layer is also considered, then the total time for a complete imprint step, $\Delta t_{imp\text{-}step}$, from the beginning of a single NAIL imprint step until a subsequent NAIL imprint step, can be ~15 seconds, employing the NAIL system of FIG. 9.

With this description of the NAIL method of the invention, it is shown that the NAIL process provides a number of particular advantages, including the ability to employ a set of distinct imprint nanotemplates, rather than one single template, to imprint a complex pattern in the manner of a typewriter. The NAIL nanotemplates can be attached to a NAIL super-template for conveniently maintaining the set of nanotemplates. The invention further provides an ability to imprint different regions of a common imprint layer with different nanotemplates or with the same nanotemplate to create a pattern that is more complex and that is larger than any of the individual nanotemplates, as opposed to performing multiple imprints with exclusively one template at one location of the imprint polymer layer. Each nanotemplate is only a portion of the final desired pattern and can be employed to form complex, near-arbitrary patterns. One or more nanotemplates, each of a distinct shape, can be used in two or more sequential NAIL imprint steps forming a NAIL process for printing a final desired pattern. The NAIL process eliminates the need for custom fabrication of an imprint template because a given set of nanotemplates can be used over and over for multiple imprint applications to produce patterns that are specific to each application.

It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A method for imprinting a layer of material comprising:
    forming a material layer on a substrate;
    employing a set of nanotemplates each having a different geometric feature, impressing into the material layer a nanotemplate that is selected from the nanotemplate set;
    maintaining the selected nanotemplate impressed in the material layer until a geometric trench corresponding to the geometric feature of the selected nanotemplate is formed in the layer;
    removing the selected nanotemplate from the material layer;
    repeatedly forming a nanotemplate geometric trench in the material layer by nanotemplate impressions in the layer with a plurality of distinct selected nanotemplates from the set of nanotemplates, partially overlapping ends of nanotemplate impressions in a plurality of the impressions, until a final desired imprint pattern is produced in the layer, where each nanotemplate geometric trench is characterized by an extent across the material layer that is a fraction of an extent of the final desired imprint pattern; and
    maintaining the material layer in a condition for accepting nanotemplate impressions continuously throughout the nanotemplate impression repetition.

2. The method of claim 1 wherein the nanotemplate comprises a closed geometric feature having an extent between about 1 nm and about 100 micrometers.

3. The method of claim 1 wherein the repeated formation of geometric trenches in the material layer comprises formation of at least two trenches of substantially identical nanotemplate geometry.

4. The method of claim 1 further comprising:
    replicating the final desired imprint pattern in the material layer by continuing the repeated formation of a geometric trench until a selected number of desired final pattern replications are produced in the material layer; and
    maintaining the material layer in a condition for accepting nanotemplate impressions continuously throughout the final pattern replication.

5. The method of claim 1 wherein at least two of the repeated nanotemplate impressions of the final desired imprint pattern in the material layer are spatially separated from each other, forming distinct and spatially separated geometric trenches in the layer.

6. The method of claim 1 wherein at least two of the final desired imprint pattern repetitions are not identical.

7. The method of claim 1 wherein replicating the final desired imprint pattern in the material layer comprises adding at least one nanotemplate geometric trench to at least one of the final desired imprint pattern repetitions.

8. The method of claim 1 wherein the nanotemplate is provided on a super-template that includes the set of distinct nanotemplates.

9. The method of claim 8 wherein the super-template is planar.

10. The method of claim 8 wherein the super-template comprises silicon.

11. The method of claim 8 wherein the super-template comprises fused silica.

12. The method of claim 8 wherein the super-template is nonplanar.

13. The method of claim 12 wherein the super-template is characterized as a curved tip.

14. The method of claim 13 wherein the super-template comprises an atomic force microscope tip.

15. The method of claim 13 wherein the super-template comprises a stylus tip.

16. The method of claim 1 wherein the nanotemplate comprises a substrate structure including a nanotemplate geometry at the surface of the substrate structure.

17. The method of claim 16 wherein the nanotemplate further comprises a pattern layer that includes the nanotemplate geometry and is disposed on the substrate.

18. The method of claim 17 wherein the nanotemplate further comprises an impression release layer disposed on the pattern layer of the nanotemplate.

19. The method of claim 18 wherein the nanotemplate release layer comprises $C_8H_4Cl_3F_{13}Si$.

20. The method of claim 17 wherein the nanotemplate pattern layer comprises HSQ.

21. The method of claim 17 wherein the nanotemplate pattern layer comprises PMMA.

22. The method of claim 17 wherein the nanotemplate pattern layer comprises photoresist.

23. The method of claim 17 wherein the nanotemplate pattern layer comprises h-PDMS.

24. The method of claim 16 wherein the nanotemplate substrate structure comprises silicon.

25. The method of claim 16 wherein the nanotemplate substrate structure comprises fused silica.

26. The method of claim 1 wherein at least two of the repeated nanotemplate impressions in the material layer are spatially separated from each other, forming distinct and spatially separated geometric trenches in the layer.

27. The method of claim 1 wherein at least two of the repeated nanotemplate impressions in the material layer are rotated, relative to each other, in a plane of the material layer.

28. The method of claim 1 wherein at least two of the repeated nanotemplate impressions in the material layer are translated, relative to each other, in a plane of the material layer.

29. The method of claim 1 wherein at least one of the nanotemplate geometric trenches formed in the material layer extends substantially through a thickness of the material layer, with an insubstantial amount of the material layer remaining at trench bottom.

30. The method of claim 1 wherein at least one of the nanotemplate geometric trenches formed in the material layer extends through only a portion of thickness of the material layer, leaving a measurable amount of the material layer remaining at trench bottom.

31. The method of claim 1 wherein at least two of the repeated nanotemplate impressions in the material layer are adjacent to each other, separated by a distance that results in lateral distortion of a first resulting geometric trench as a second geometric trench is formed.

32. The method of claim 1 wherein a nanotemplate geometric feature comprises a curved geometric feature.

33. The method of claim 1 wherein a nanotemplate geometric feature comprises a rectangular geometric feature.

34. The method of claim 1 wherein maintaining the material layer in a condition for accepting nanotemplate impressions comprises heating the material layer continuously throughout the nanotemplate impression repetition.

35. The method of claim 1 further comprising solidifying the final desired imprint pattern in the material layer at the end of the nanotemplate geometric trench repetition.

36. The method of claim 35 wherein solidifying the final desired imprint pattern in the material layer comprises cooling the material layer from a first material layer temperature maintained during the nanotemplate geometric trench repetition to a second material layer temperature that is less than the first material layer temperature.

37. The method of claim 35 wherein solidifying the final desired imprint pattern in the material layer comprises exposing the material layer to a selected form of radiation.

38. The method of claim 1 wherein the substrate comprises a microelectronic substrate.

39. The method of claim 38 wherein the substrate comprises silicon.

40. The method of claim 1 wherein the substrate includes at least one surface layer underlying the material layer.

41. The method of claim 1 wherein maintaining the material layer in a condition for accepting nanotemplate impressions comprises maintaining the layer soft enough to be imprinted with a nanotemplate and mechanically stable enough that during the nanotemplate trench formation repetition, the material layer does not substantially backflow into previously imprinted geometric trenches.

42. The method of claim 1 wherein the material layer comprises a polymer.

43. The method of claim 42 wherein the material layer comprises PMMA.

44. The method of claim 42 wherein the material layer comprises HSQ.

45. The method of claim 42 wherein the material layer comprises PDMS.

46. The method of claim 42 wherein the material layer comprises T5oCx.

47. The method of claim 42 wherein the material layer comprises PS.

48. The method of claim 47 wherein the PS layer comprises a PS molecular weight between about 10 Kg/mol and about 300 Kg/mole.

49. The method of claim 42 wherein the material layer comprises tris(benzoylacetonato)-mono(phenanthroline)-europium(III).

50. The method of claim 42 wherein the material layer comprises tris(dibenzoylmethane)-mono-(phenanthroline) europium(III).

51. A method for imprinting a layer of material comprising:
providing on a substrate an imprint material layer having a material layer extent on the substrate;
heating the imprint material layer across the extent of the layer on the substrate;
employing a set of nanotemplates each having a different geometric feature, impressing into the heated material layer a nanotemplate that is selected from the nanotemplate set;
maintaining the selected nanotemplate impressed in the material layer until a geometric trench corresponding to the geometric feature of the selected nanotemplate is formed in the layer;
removing the selected nanotemplate from the material layer;
repeatedly forming nanotemplate geometric trenches in the material layer by nanotemplate impressions in the layer with a plurality of distinct selected nanotemplates from the set of nanotemplates, partially overlapping ends of nanotemplate impressions in a plurality of the impressions, until a final desired imprint pattern is produced in the layer, where each nanotemplate geometric trench is characterized by an extent across the material layer that is a fraction of an extent of the final desired imprint pattern; and
maintaining continuous heating of the imprint material layer across the extent of the imprint material layer on the substrate throughout the repetition of nanotemplate impression into and removal from the imprint material layer until the final desired imprint pattern formation in the layer is complete.

52. The method of claim 51 wherein heating the imprint material layer across the extent of the layer on the substrate comprises heating the material layer to about a glass transition temperature that is characteristic for the material layer.

53. The method of claim 51 wherein the material layer comprises a polymer.

54. The method of claim 53 wherein the material layer is selected from PMMA and PS.

55. A method for imprinting a layer of material comprising:
employing a set of nanotemplates each having a different geometric feature, impressing into an imprint material layer a first nanotemplate that is selected from the nanotemplate set;
maintaining the first nanotemplate impressed in the material layer until a first geometric trench corresponding to the geometric feature of the first nanotemplate is formed in the layer;
removing the first nanotemplate from the material layer;
impressing a second nanotemplate into the material layer at a location that overlaps the first geometric trench, the second nanotemplate being selected from the set of nanotemplates and having a geometric feature that is different than that of the first nanotemplate;

maintaining the second nanotemplate impressed in the material layer until a second geometric trench corresponding to the geometric feature of the second nanotemplate is formed in the layer, the first and second geometric trenches together forming a single feature of a final desired pattern in the material layer;

removing the second nanotemplate from the material layer;

repeatedly forming geometric trenches in the material layer with at least two different nanotemplates, from the set of nanotemplates, by impressions in the material layer, partially overlapping ends of nanotemplate impressions in a plurality of the impressions, until a final desired imprint pattern is produced in the layer, each trench being characterized by an extent across the material layer that is a fraction of an extent of the final desired imprint pattern; and maintaining the material layer in a condition for accepting impressions continuously throughout the impression repetition until the final desired imprint pattern formation in the material layer is complete.

56. The method of claim 55 wherein the material layer is disposed on a substrate.

57. The method of claim 56 further comprising transferring the final desired pattern in the material layer to the substrate.

58. The method of claim 56 further comprising transferring the final desired pattern in the material layer to a substrate surface layer underlying the material layer.

59. The method of claim 55 wherein the repeated formation of geometric trenches in the material layer comprises formation of at least two trenches of substantially identical nanotemplate geometry.

* * * * *